(12) United States Patent
Dakshina-Murthy et al.

(10) Patent No.: US 7,235,474 B1
(45) Date of Patent: Jun. 26, 2007

(54) SYSTEM AND METHOD FOR IMPRINT LITHOGRAPHY TO FACILITATE DUAL DAMASCENE INTEGRATION WITH TWO IMPRINT ACTS

(75) Inventors: Srikanteswara Dakshina-Murthy, Wappingers Falls, NY (US); Bhanwar Singh, Morgan Hill, CA (US); Ramkumar Subramanian, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 388 days.

(21) Appl. No.: 10/838,612

(22) Filed: May 4, 2004

(51) Int. Cl.
*H01L 21/44* (2006.01)
(52) U.S. Cl. .............................. 438/597; 257/E21.585
(58) Field of Classification Search ................ 438/597; 257/E21.585
See application file for complete search history.

(56) References Cited

U.S. PATENT DOCUMENTS

| | | | | |
|---|---|---|---|---|
| 5,658,418 A | * | 8/1997 | Coronel et al. ........ | 156/345.25 |
| 6,138,712 A | * | 10/2000 | Hirose ........................ | 137/559 |
| 6,166,819 A | * | 12/2000 | Schnabel .................... | 356/504 |
| 6,476,920 B1 | * | 11/2002 | Scheiner et al. ............ | 356/630 |
| 6,486,675 B1 | * | 11/2002 | Jaiprakash et al. ......... | 324/533 |
| 6,545,753 B2 | * | 4/2003 | Subramanian et al. ... | 356/237.5 |
| 6,559,942 B2 | * | 5/2003 | Sui et al. .................... | 356/369 |
| 6,650,426 B1 | * | 11/2003 | Zalicki ....................... | 356/626 |

* cited by examiner

*Primary Examiner*—Asok Kumar Sarkar
(74) *Attorney, Agent, or Firm*—Amin, Turocy & Calvin, LLP

(57) ABSTRACT

A system and method are provided to facilitate dual damascene interconnect integration with two imprint acts. The method provides for creation of a pair of translucent imprint molds containing the dual damascene pattern to be imprinted. The first imprint mold of the pair contains the via features of the dual damascene pattern and the second imprint mold of the pair contains the trench features. The via feature imprint mold is brought into contact with a first imaging layer deposited upon a first transfer layer which is deposited upon a dielectric layer of a substrate. The trench feature imprint mold is brought into contact with a second imaging layer deposited upon a second transfer layer which is deposited upon the first imaging layer of the substrate. When each imaging layer is exposed to a source of illumination, it cures with a structure matching the features of the corresponding imprint mold. A sequence of etches transfer and combine the via features from the first imaging layer with the trenches from the second imaging layer to create the dual damascene openings within the dielectric layer.

22 Claims, 21 Drawing Sheets

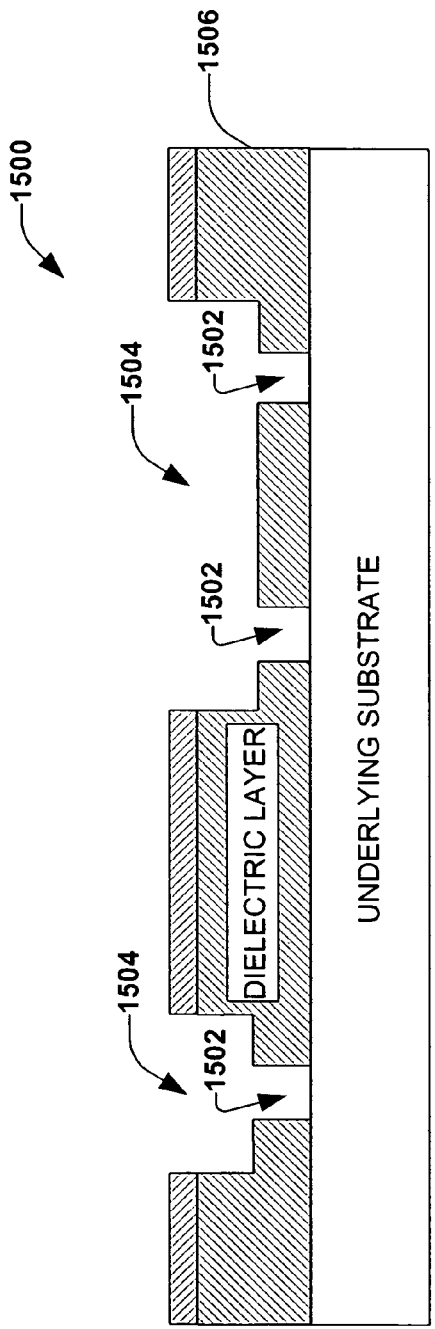
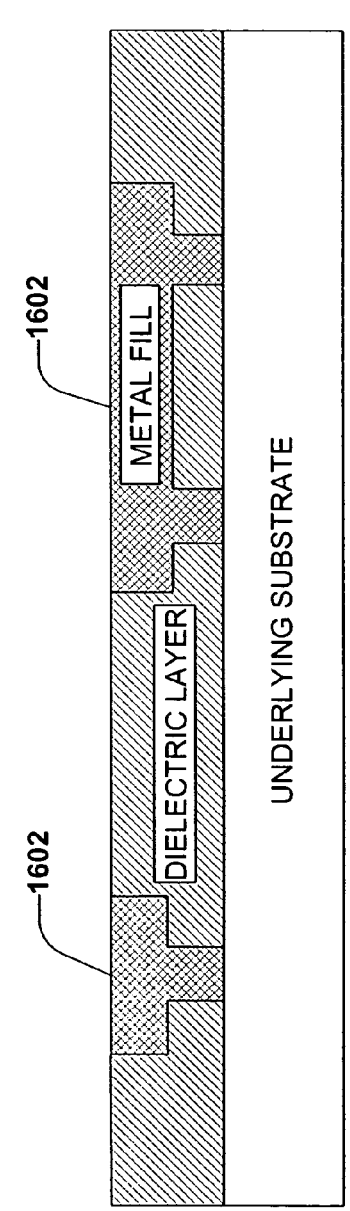

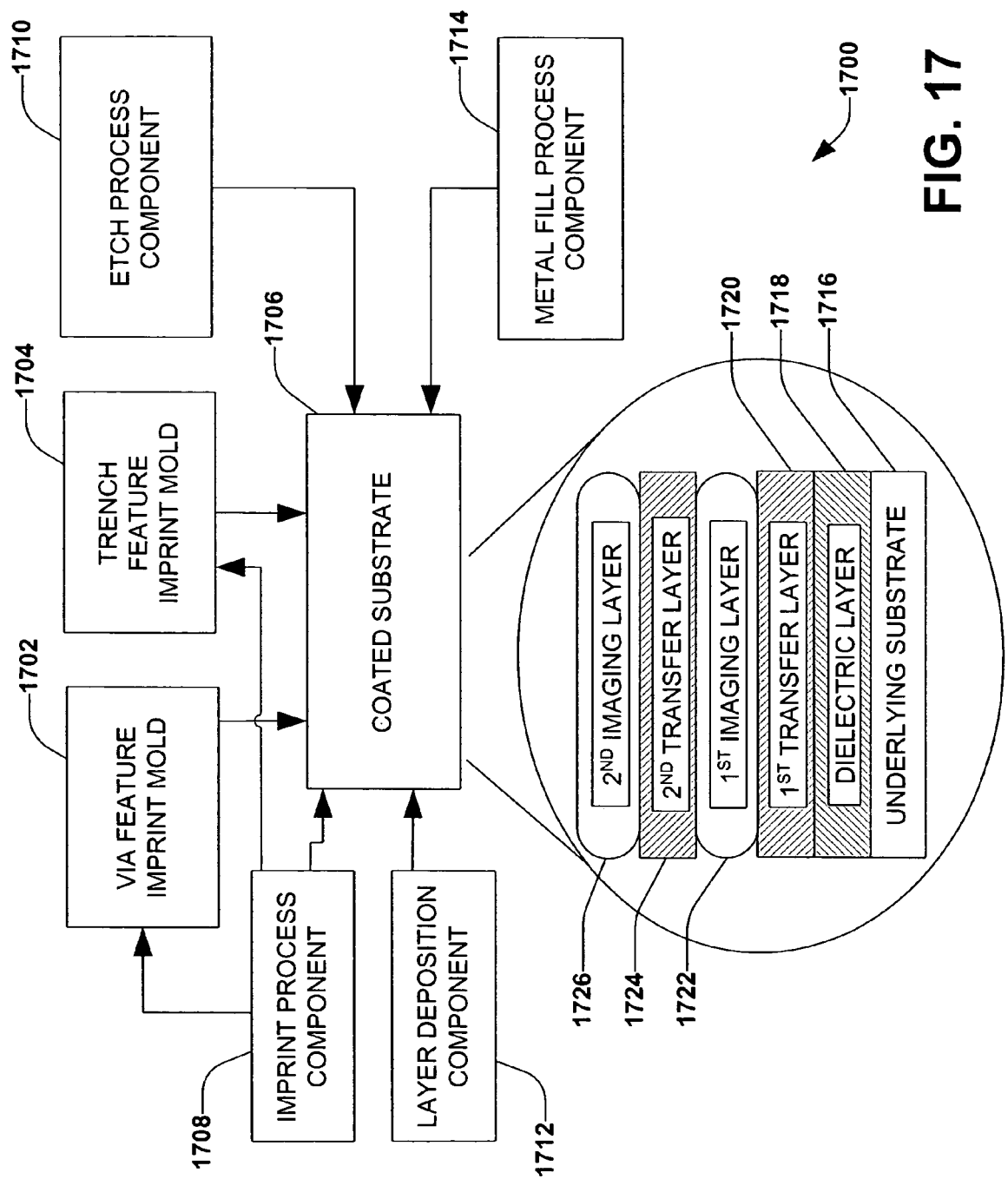

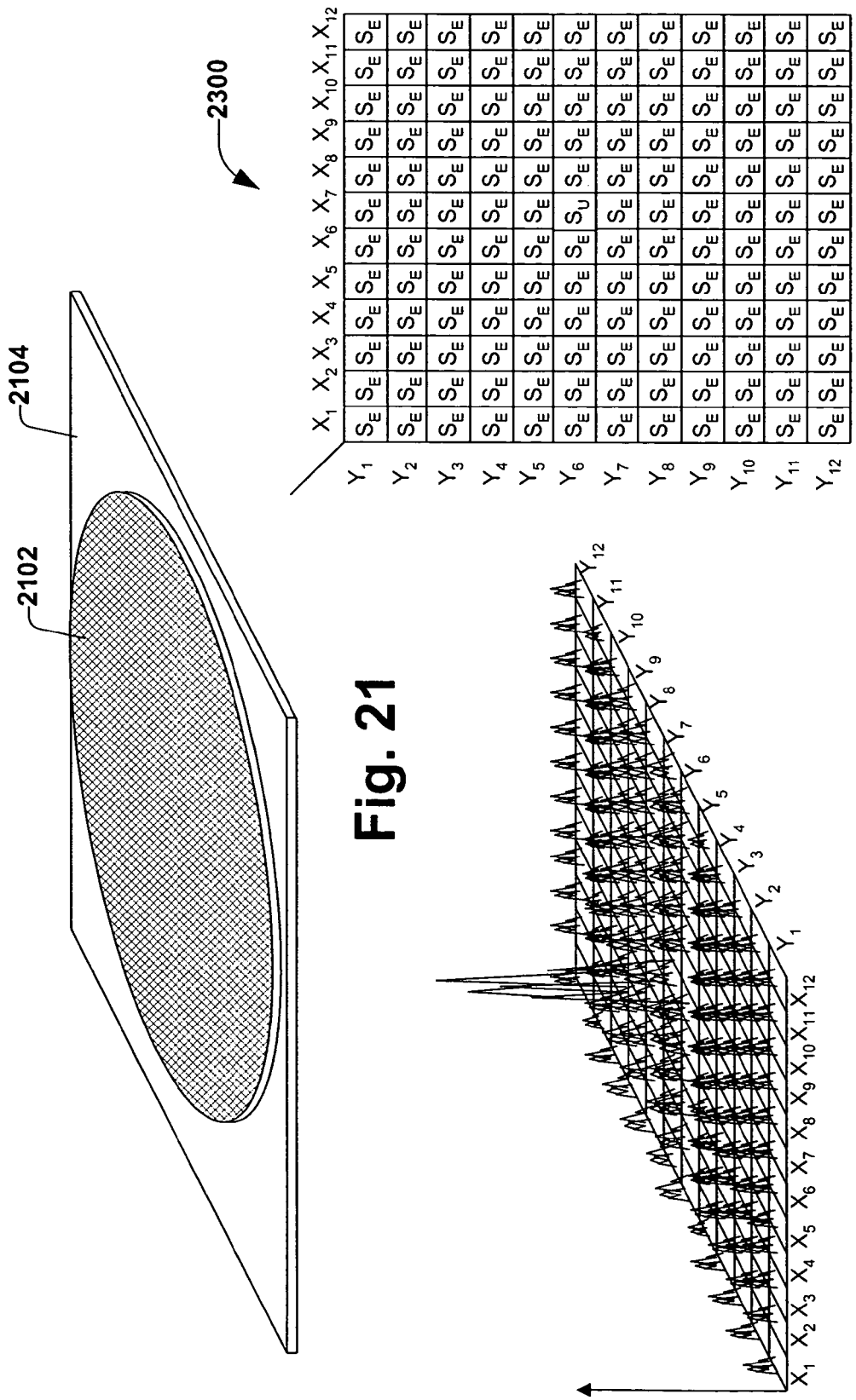

SYSTEM AND METHOD FOR IMPRINT LITHOGRAPHY TO FACILITATE DUAL DAMASCENE INTEGRATION WITH TWO IMPRINT ACTS

FIELD OF THE INVENTION

The present invention generally relates to semiconductor processing and, more particularly, to systems and methods for imprint lithography that facilitate dual damascene interconnect integration with two imprint acts.

BACKGROUND OF THE INVENTION

In the semiconductor industry, there is a continuing trend toward higher device densities. To achieve these high densities there have been, and continue to be, efforts toward scaling down device dimensions (e.g., at sub-micron levels) on semiconductor wafers. In order to accomplish such high device packing densities, smaller and smaller feature sizes are required. This includes the width and spacing of interconnecting lines, spacing and diameter of contact holes, and the surface geometry, such as corners and edges, of various features. The dimensions of and between such small features can be referred to as critical dimensions. With an ever increasing number of integrated circuit features being formed on a circuit die, the importance of properly designing patterns to form structures that are isolated and non-interfering with one another has also increased.

The requirement of small features with close spacing between adjacent features requires high resolution lithographic processes. In general, lithography refers to processes for pattern transfer between various media. It is a technique used for integrated circuit fabrication in which a silicon structure is coated uniformly with a radiation-sensitive film (the resist or lithographic coating) and an exposing source (such as optical light, x-rays, or an electron beam) illuminates selected areas of the surface through an intervening master template. The intervening master template is generally known as a mask, photomask, or reticle for a particular pattern. The lithographic coating is generally a radiation-sensitive coating suitable for receiving a projected image of the subject pattern. Once the image is projected, it is indelibly formed in the coating. The projected image may be either a negative image or a positive image of the subject pattern. Exposure of the coating through a reticle, mask or photomask causes the image area to become either more or less soluble (depending on the coating) in a particular solvent developer. The more soluble areas are removed in the developing process to leave the pattern image in the coating as less soluble polymer.

The process of manufacturing semiconductors (e.g., integrated circuits, ICs, chips) employing masks typically consists of more than a hundred steps, during which hundreds of copies of an integrated circuit may be formed on a single wafer. Generally, the process involves creating several patterned layers on and into the substrate that ultimately forms the complete integrated circuit. The patterned layers are created, in part, by the light that passes through the masks. A series of lenses provides for reduction in size from the mask to the projected image onto the resist. The optical equipment for traditional photolithographic processes requires significant capital investment.

Imprint lithography (also know as nanoprint lithography, nanoprint, nanoimprint or nanoimprint lithography) technologies are emerging which provide an alternative in which the capital investment is significantly reduced in part because patterns are exposed through a 1:1 mask or mold in close proximity to the wafer. Imprint lithography is relatively inexpensive because it avoids costly optics, as well as cumbersome enhancement techniques like phase-shift masks. Capital cost for equipment is far less than typical step-and-scan or scan and repeat systems. Imprint lithography does not depend on costly optical elements; rather, the line width is determined by the mask or mold.

One advantage of imprint lithography is that the circuit designers do not need to be concerned about optical proximity correction which limits how patterns are placed on the mask. However, because imprint lithographic methods do not utilize the typical 4× optical reduction employed in conventional lithographic processes, the small feature sizes are more difficult to achieve. In order to produce devices with similar critical dimensions to conventional optical lithographic methods, new processes and techniques are required. Techniques which facilitate integration of three dimensional features in substrates can further extend the utility of imprint lithography.

SUMMARY OF THE INVENTION

The following presents a simplified summary of the invention in order to provide a basic understanding of some aspects of the invention. This summary is not an extensive overview of the invention. It is intended to neither identify key or critical elements of the invention nor delineate the scope of the invention. Its sole purpose is to present some concepts of the invention in a simplified form as a prelude to the more detailed description that is presented later.

Systems and methods for imprint lithography are provided that facilitate the integration of dual damascene interconnect features with two imprint acts. The present invention facilitates reproduction of features required for production of integrated circuits; specifically the invention provides for integration of dual damascene interconnect features (i.e. vias and trenches) with two imprint acts. The present invention provides for the creation of two translucent imprint molds. The first imprint mold provides a pattern for the vias of the dual damascene pattern and the second imprint mold provides a pattern for the trenches of the dual damascene pattern. Once created, the dual damascene imprint molds are utilized in a series of operations to imprint the dual damascene pattern. In accordance with one aspect of the invention, scatterometry is used to generate observed optical signatures for comparison to known optical signatures to facilitate evaluation of the imprint molds for contamination and wear.

The methodology utilizes a wafer comprising a dielectric layer deposited upon an underlying substrate. The dielectric layer is the layer into which the dual damascene interconnect pattern is to be integrated. In accordance with one aspect of the invention, a first organic transfer layer is then spin coated or otherwise deposited upon the dielectric layer. Subsequently, a first imaging layer comprising low viscosity, photopolymerizable, organosilicon is deposited upon the first transfer layer. The via feature imprint mold is then brought into contact with the first transfer layer with the organosilicon filling any gap between the via feature imprint mold and the first transfer layer. After the via feature imprint mold is in position, the low viscosity, photopolymerizable, organosilicon is exposed by ultraviolet light through the back of the translucent via feature imprint mold. Once exposed, the low viscosity, photopolymerizable, organosilicon cures and creates a solidified, silicon rich replica of the via features of the via feature imprint mold.

In accordance with another aspect of the invention, a second organic transfer layer is then spin coated or otherwise deposited upon the first imaging layer. Subsequently, a second imaging layer comprising low viscosity, photopolymerizable, organosilicon is deposited upon the second transfer layer. The trench feature imprint mold is then brought into contact with the second transfer layer with the organosilicon of the second imaging layer filling any gap between the trench feature imprint mold and the second transfer layer. After the trench feature imprint mold is in position, the low viscosity, photopolymerizable, organosilicon is exposed by ultraviolet light through the back of the translucent trench feature imprint mold. Once exposed, the low viscosity, photopolymerizable, organosilicon cures and creates a solidified, silicon rich replica of the trench features of the trench feature imprint mold.

Once the via and trench features have been imprinted in the imaging layers, the via and trench features must be combined and transferred through to the dielectric layer. In accordance with one aspect of the present invention, a sequence of halogen breakthrough etches, oxygen transfer etches, and dielectric etches transfer and combine the via features from the first imaging layer with the trenches from the second imaging layer to create the completed dual damascene pattern within the dielectric layer.

In accordance with another aspect of the present invention, scatterometry is used to evaluate the depth of penetration of the via features of the dual damascene pattern into the dielectric layer. Scatterometry techniques are used to facilitate generation of an observed optical signature that is compared to a library of optical signatures wherein each optical signature in the library corresponds to a known depth of penetration into the dielectric layer. The methodology proceeds to transfer the trench features into the dielectric layer of the dual damascene pattern only after the proper depth of transfer for the via features of the pattern is obtained.

In accordance with yet another aspect of the present invention, the parameters of one or more etch processes may be altered based at least in part on the results of a comparison of an observed optical signature to a library of optical signatures. For example, if the observed optical signature corresponds to an insufficient depth of penetration into the dielectric layer, the duration of the etch process as performed on succeeding devices is increased to allow for a deeper etch penetration. Similarly, if the observed optical signature corresponds to an over etch condition where the depth of penetration into the dielectric layer is too deep, the duration of the etch process on succeeding devices is decreased to allow for a shallower etch penetration.

Once the via features and the trench features of the dual damascene pattern are transferred into the dielectric layer, the via and trench openings are filled with an appropriate metallization and the substrate is then planarized to complete the dual damascene interconnect integration.

The following description and the annexed drawings set forth in detail certain illustrative aspects of the invention. These aspects are indicative, however, of but a few of the various ways in which the principles of the invention may be employed and the present invention is intended to include all such aspects and their equivalents. Other advantages and novel features of the invention will become apparent from the following detailed description of the invention when considered in conjunction with the drawings.

BRIEF DESCRIPTION OF THE DRAWINGS

FIG. 15 is an illustration of a substrate wherein the dielectric layer comprises the vias and trenches of the dual damascene pattern in accordance with an aspect of the present invention.

FIG. 16 is an illustration of a substrate after deposition of conductive material to fill the dual damascene openings and subsequent planarization of the resulting substrate in accordance with an aspect of the present invention.

FIG. 17 is an illustration of a high level block diagram of a system for integrating dual damascene interconnect patterns with two imprint acts in accordance with an aspect of the present invention.

FIG. 21 illustrates a perspective view of a grid-mapped substrate in accordance with one or more aspects of the present invention.

FIG. 22 illustrates plots of measurements taken at grid-mapped locations on a substrate in accordance with one or more aspects of the present invention.

FIG. 23 illustrates a table containing entries corresponding to results of a comparison of observed optical signatures to expected optical signatures at respective grid-mapped locations on a substrate in accordance with one or more aspects of the present invention.

DETAILED DESCRIPTION OF THE INVENTION

Figure 1:
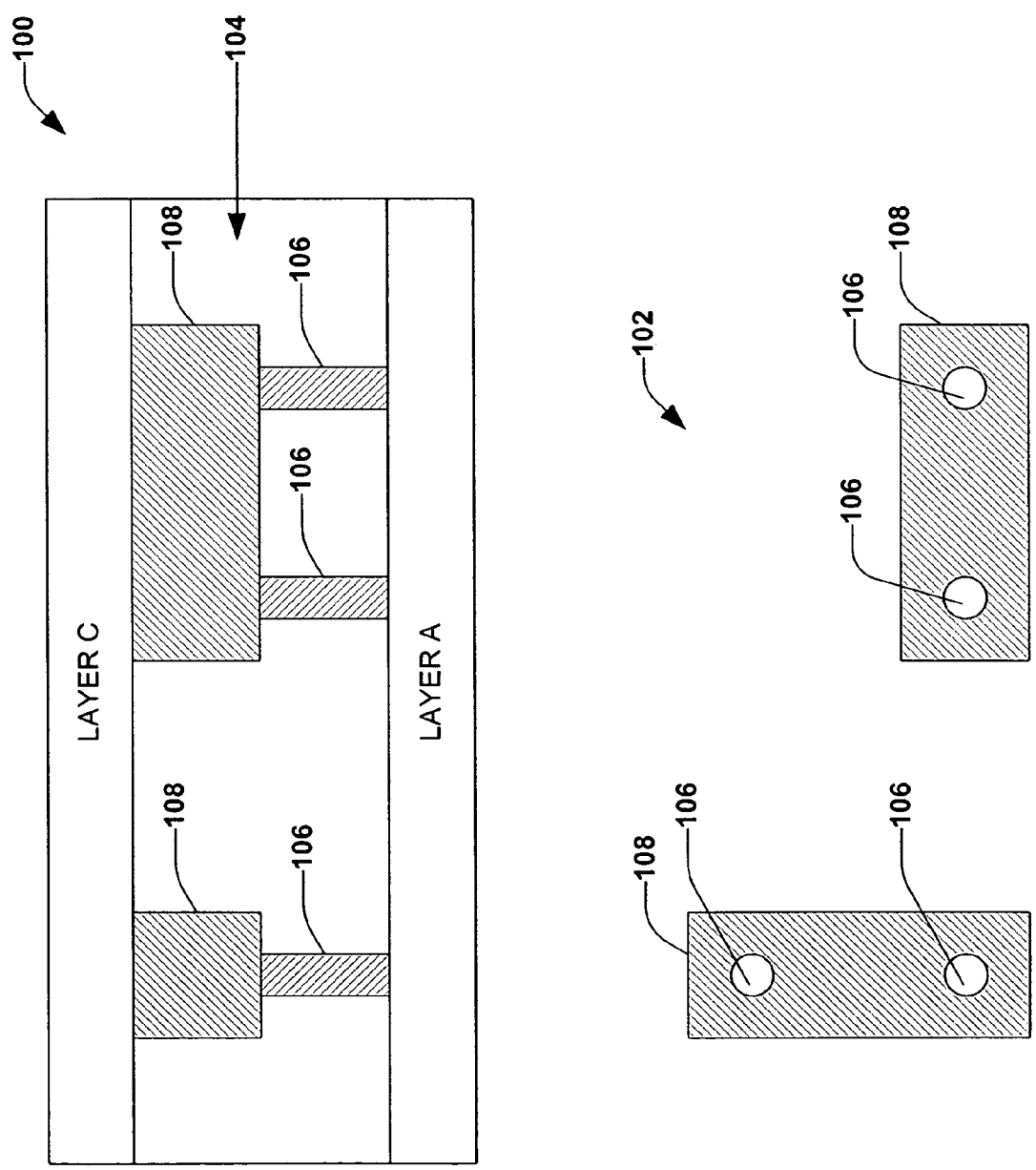
FIG. 1 is an illustration of a typical dual damascene feature utilized in a typical semiconductor substrate.

The present invention will now be described with reference to the drawings. The following detailed description is of the best mode presently contemplated by the inventors for practicing the invention. It should be understood that the description of these aspects are merely illustrative and that they should not be taken in a limiting sense.

As used in this application, the terms "mold", "imprint mold", and "imprint lithography mold" are used interchangeably to refer to an article comprising a three dimensional pattern used to imprint a pattern in deformable material utilized in the production of an integrated circuit. The terms "imprint lithography" and "nanoimprint lithography" are used interchangeably to describe a method of producing integrated circuits involving imprinting a pattern onto a resist and subsequent exposure by a source, typically ultraviolet light, to which the resist is reactive.

Furthermore, the term "component" as used in this application is intended to refer to a computer-related entity, either hardware, a combination of hardware and software, software, or software in execution. For example, a component may be, but is not limited to being a process running on a processor, a processor, an object, an executable, a thread of execution, a program, a set of co-operating computers and/or processes and a computer.

The present invention facilitates reproduction of small features required to facilitate the production of integrated circuits through imprint lithography. More specifically, the present invention provides systems and methods that facilitate the integration of dual damascene interconnect features with two imprint acts.

Generally speaking, in imprint lithographic processes, a UV-transmittable quartz mask/mold is pressed into a thin film of low viscosity UV-curable monomer coated onto a substrate. Subsequent exposure of the substrate by UV-irradiation through the mask/mold results in polymerization and curing of the resist in the imprinted. Thereafter the mold is removed leaving a three-dimensional replica of its pattern in the cured imprint polymer. Finally, the residual imprint layer in the depressed areas is removed by high anisotropic reactive ion etching.

Damascene (single damascene) is an interconnection fabrication process in which grooves are formed in an insulating structure and filled with metal to form the conductive lines. Dual damascene is a multi-level interconnection process in which, in addition to forming the grooves of single damascene, the conductive via openings also are formed. Using a dual damascene process, semiconductor devices are patterned with several thousand openings for conductive lines and vias which are filled with a conductive metal, such as aluminum, copper, tungsten and gold and serve to interconnect the active and/or passive elements of the integrated circuit. The dual damascene process is also used for forming the multilevel signal lines of conductive metal in the insulating layers of multilayer substrates.

FIG. 1 is an illustration of a cross section view 100 and a corresponding top view 102 of a conventional dual damascene pattern utilized to provide electrical connections between active and/or passive elements of integrated circuit layers in a semiconductor wafer or substrate. Cross section view 100 illustrates dielectric layer 104 comprised of dielectric material, vias 106, and trenches 108. The vias 106 and trenches 108 provide electrical connections between active and/or passive elements in layers adjacent to the dielectric layer. The dual damascene pattern is utilized extensively in semiconductor wafers produced by traditional optical lithographic processes.

Figure 2:
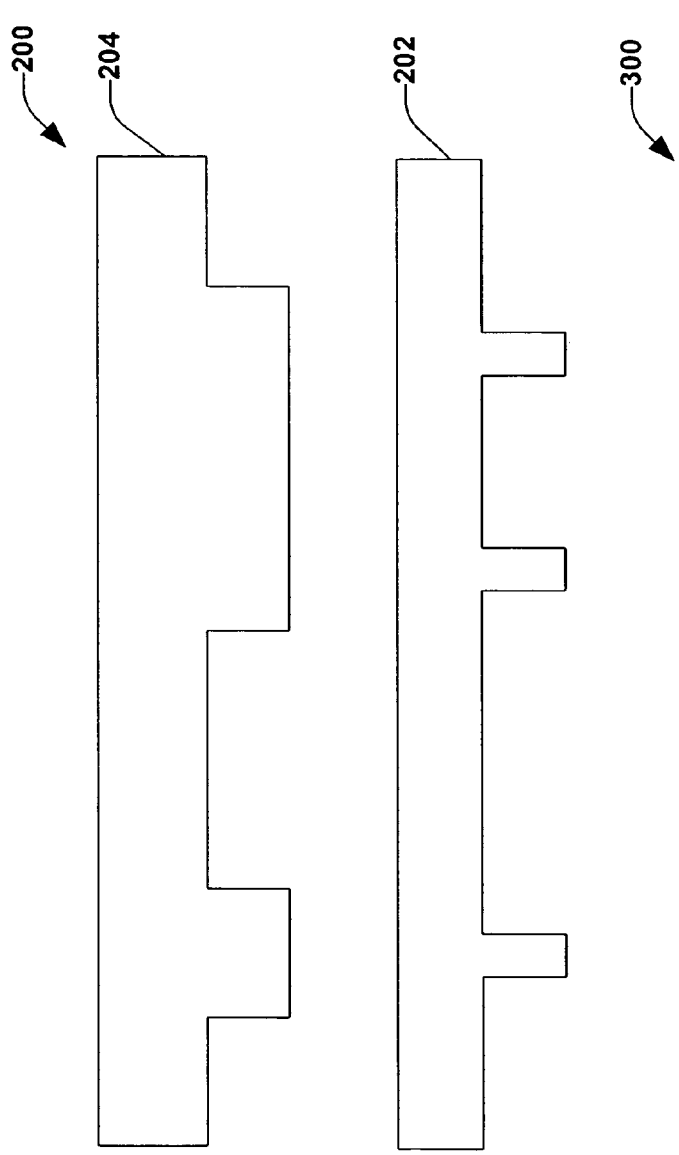
FIG. 2 is an illustration of a pair of translucent imprint lithography molds comprising dual damascene features in accordance with an aspect of the present invention.

For imprint lithography, the present invention provides systems and methods to facilitate the integration of dual damascene interconnect features with two imprint acts. FIGS. 2 through 16 illustrate the process of producing dual damascene interconnect features utilizing two imprint acts. FIG. 2 is an illustration 200 of a pair of translucent imprint lithography molds 202 and 204 utilized in conjunction with each other to imprint the dual damascene pattern in accordance with an aspect of the present invention. Mold 202 is a translucent mold comprising the via features of the dual damascene pattern in accordance with an aspect of the present invention. Mold 204 is a translucent mold comprising the trench features of the dual damascene pattern in accordance with an aspect of the present invention. Imprint molds 202 and 204 are utilized to imprint the dual damascene pattern on a substrate which is further processed to transfer and combine the pattern of the molds into a dielectric layer of the substrate. Imprint molds 202 and 204 are translucent, made, for example, of quartz, silicon dioxide or other suitable translucent material. Each mold facilitates exposure of the substrate by, for example, ultraviolet light, passing through the mold from a source on the side of the mold opposite the substrate.

Figure 3:
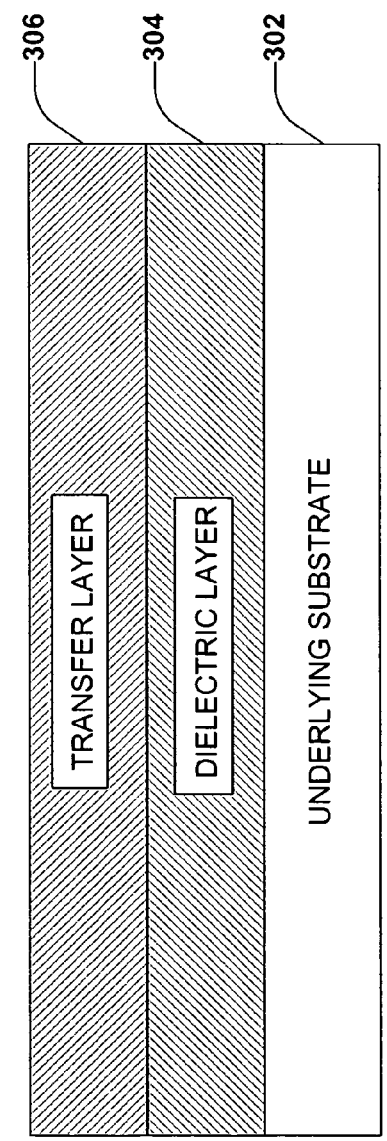
FIG. 3 is an illustration of a substrate suitable for imprint lithography in accordance with an aspect of the present invention.

FIG. 3 is an illustration of a substrate 300 suitable for imprint lithography in accordance with aspect of the present invention. Substrate 300 is comprised of an underlying substrate 302 comprising on or more layers, a dielectric layer 304 and a transfer layer 306. Underlying substrate 302 includes any and all layers and structures fabricated in the semiconductor up to this point in processing. Underlying substrate 302 may include one or more structures such as active elements and passive elements including polysilicon gates, wordlines, source regions, drain regions, bit lines, bases, emitters, collectors, conductive lines, conductive plugs, diffusion regions, etc.

Dielectric layer 304 is the layer into which the dual damascene interconnect structure is to be formed. Dielectric layer 304 includes dielectric material or insulating material including silicon based dielectric materials, silicates, and low k material. Silicon based dielectric materials include silicon dioxide, silicon nitride and silicon oxynitride. Silicates include fluorine doped silicon glass (FSG), tetraethylorthosilicate (TEOS), borophosphotetraethylorthosilicate (BPTEOS), phosphosilicate glass (PSG), borophosphosilicate glass (BPSG), and other suitable spin-on glass.

Low k polymer materials include one or more of polyimides, fluorinated polyimides, polysilsequioxane, benzocyclobutene (BCB), poly(arylene ester), parylene F, parylene N and amorphous polytetrafluoroethylene. Specific examples of a commercially available low k materials include those under the trade designations Flare™ from AlliedSignal, believed to be derived from perfluorobiphenyl and aromatic bisphenols; Black Diamond™ from Applied Materials; ALCAP-S from Asahi Chemical; SiLK® and Cyclotene® BCB from Dow Chemical; Teflon® polytetrafluoroethylene from DuPont; XLK and 3MS from Dow Corning; HSG RZ25 from Hitachi Chemical; HOSP™ and Nanoglass™ from Honeywell Electronic Materials; LKD from JSR Microelectronics; CORAL™ and AF4 from Novellus; mesoporous silica from Battelle PNNL; and VeloX™ PAE-2 from Schumacher.

Transfer layer 306 facilitates transferring the pattern from a mold to dielectric layer 304. In accordance with one aspect of the present invention, transfer layer 306 comprises organic material, spin coated or otherwise deposited onto dielectric layer 304. Ideal transfer layer materials adhere to the dielectric layer and to a subsequently deposited imaging layer. The transfer layer must provide high etch rate selectivity when subjected to subsequent etch processes that facilitate transfer of the desired dual damascene pattern. Conventional photoresists such as for example HR 100 from OLIN are suitable materials for the transfer layer. The transfer layer is typically not photoactive and hence is not affected by the exposure process. Instead, the etch resistive backbone of conventional photoresists (as above) is the main polymer component.

After the organic transfer layer is spin coated upon the dielectric layer, an imaging layer comprising low viscosity, photopolymerizable, organosilicon is deposited upon the transfer layer. A first translucent imprint mold is then brought into contact with the transfer layer with the organosilicon imaging layer filling any gap between the imprint mold and the transfer layer. After the translucent imprint mold is in position, the low viscosity, photopolymerizable, organosilicon is exposed through the back of the translucent imprint mold by ultraviolet light, or other light suitable to cure the photopolymerizable organosilicon. Once exposed, the low viscosity, photopolymerizable, organosilicon cures and creates a solidified, silicon rich replica of the features of the imprint mold.

Figure 4:
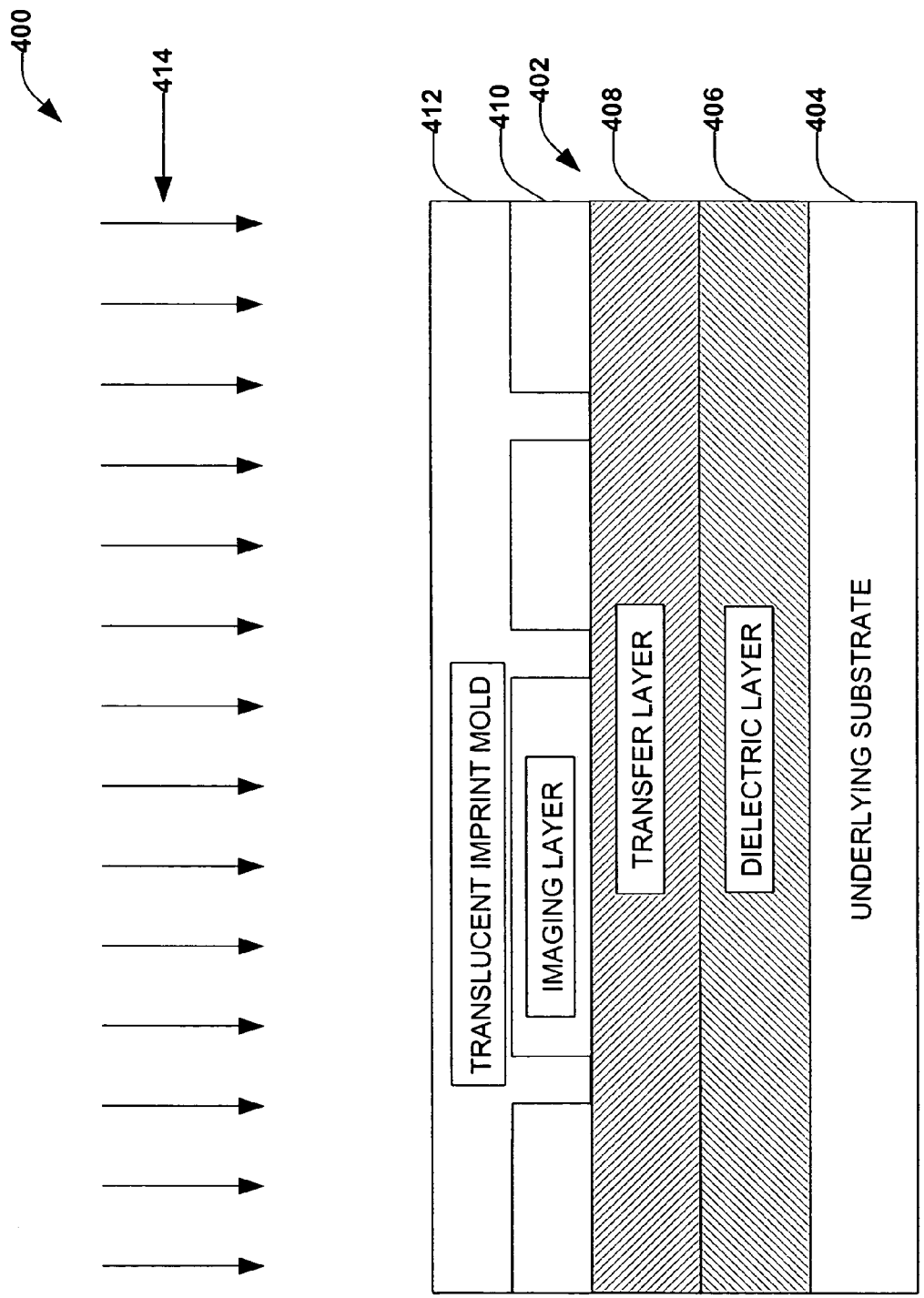
FIG. 4 is an illustration of a substrate prepared for a first imprint and exposure in accordance with an aspect of the present invention.

FIG. 4 is an illustration 400 of a substrate 402 prepared for a first imprint and exposure in accordance with an aspect of the present invention. Referring to FIG. 4, substrate 402 is comprised of underlying substrate 404, dielectric layer 406 and transfer layer 408. An imaging layer 410 is deposited upon the transfer layer 408. Imaging layer 410 comprises a low viscosity, photopolymerizable organosilicon. A translucent imprint mold 412 comprising the via features of the dual damascene pattern to be imprinted is brought into contact with transfer layer 408 with the organosilicon imaging layer 410 filling any gap between imprint mold 412 and transfer layer 408. Once translucent imprint mold 412 is properly positioned, an exposure source (not illustrated) provides illumination 414. The exposure source is a source of illumination to which the photopolymerizable imaging layer 410 is sensitive such as for example ultraviolet light. Illumination 414 passes through translucent imprint mold 412 to expose the photopolymerizable imaging layer 410. Once exposed, imaging layer 410 cures and creates a solidified, silicon rich replica of the via features of translucent imprint mold 412.

Figure 5:
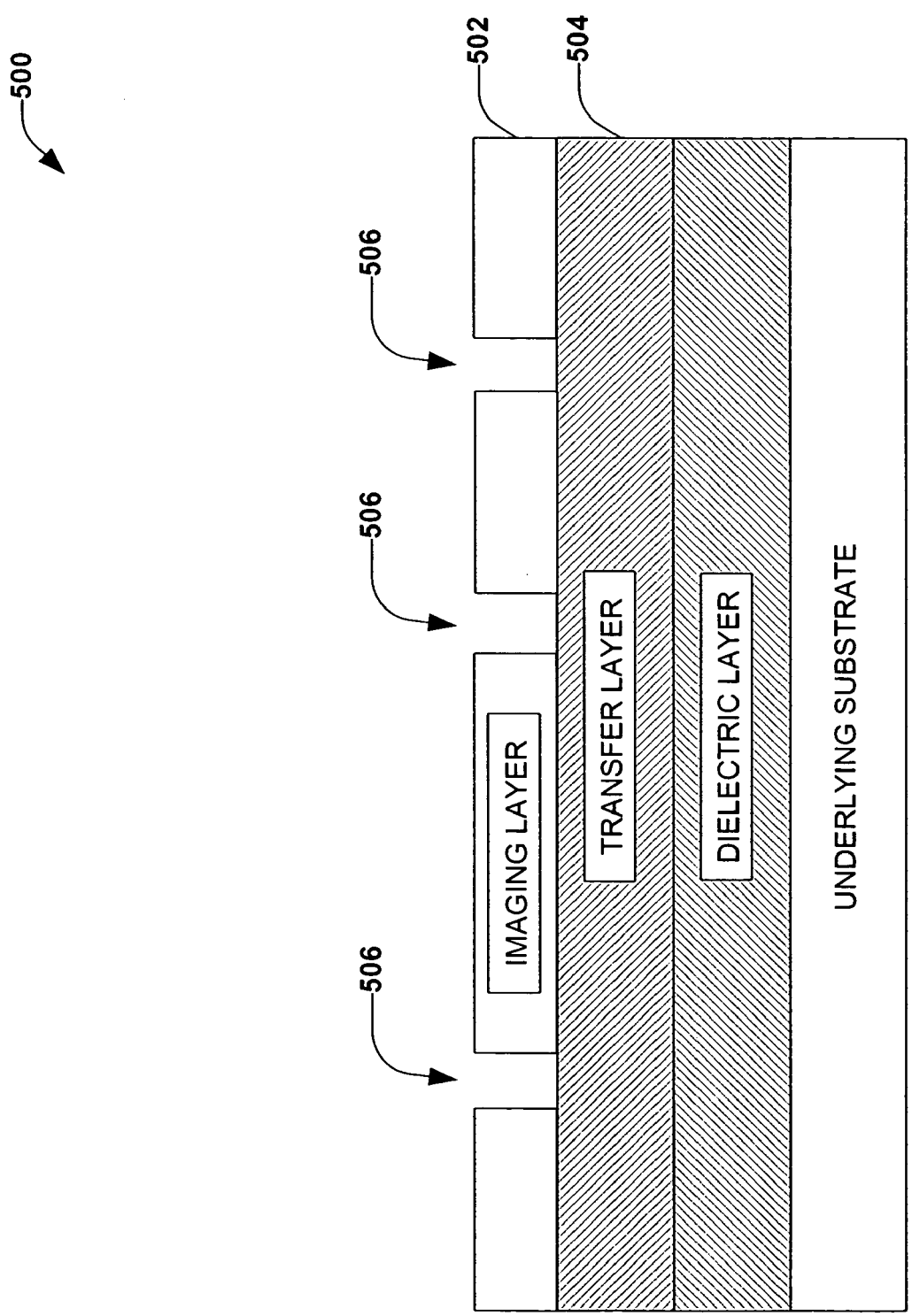
FIG. 5 is an illustration of a substrate after a first imprint and exposure in accordance with an aspect of the present invention.

At this point, translucent imprint mold 412 is removed and the resulting substrate 500 is illustrated in FIG. 5. Imaging layer 502 is cured and solidified on top of transfer layer 504. The pattern for the via features 506 of the dual damascene pattern are imprinted into solidified imaging layer 502. Once the via features of the dual damascene pattern have been imprinted in the imaging layer, in accordance with another aspect of the present invention, a second transfer layer is deposited upon the cured imaging layer. The resultant substrate is illustrated in FIG. 6.

Figure 6:
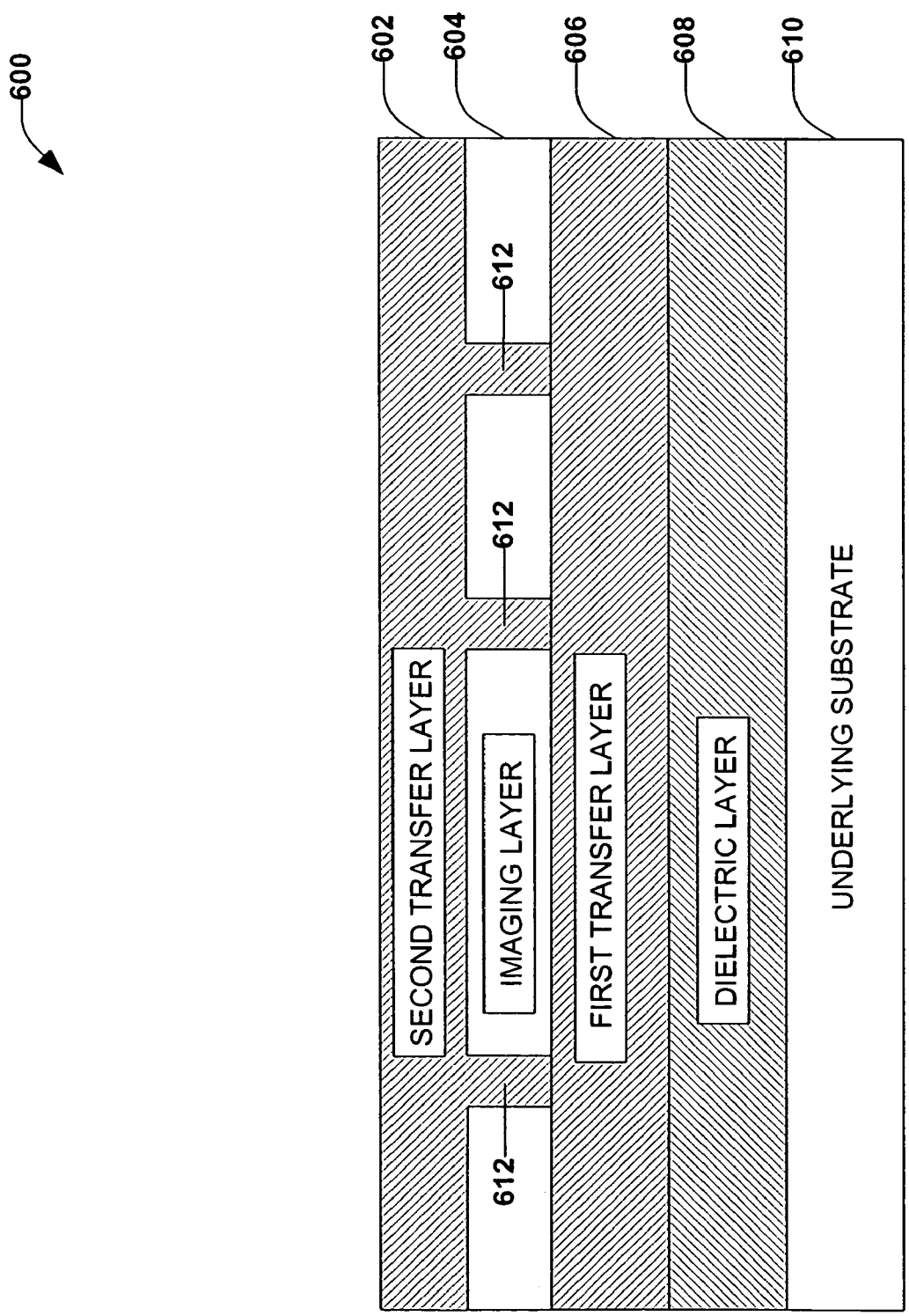
FIG. 6 is an illustration of a substrate after deposition of a second transfer layer in accordance with an aspect of the present invention.
Figure 7:
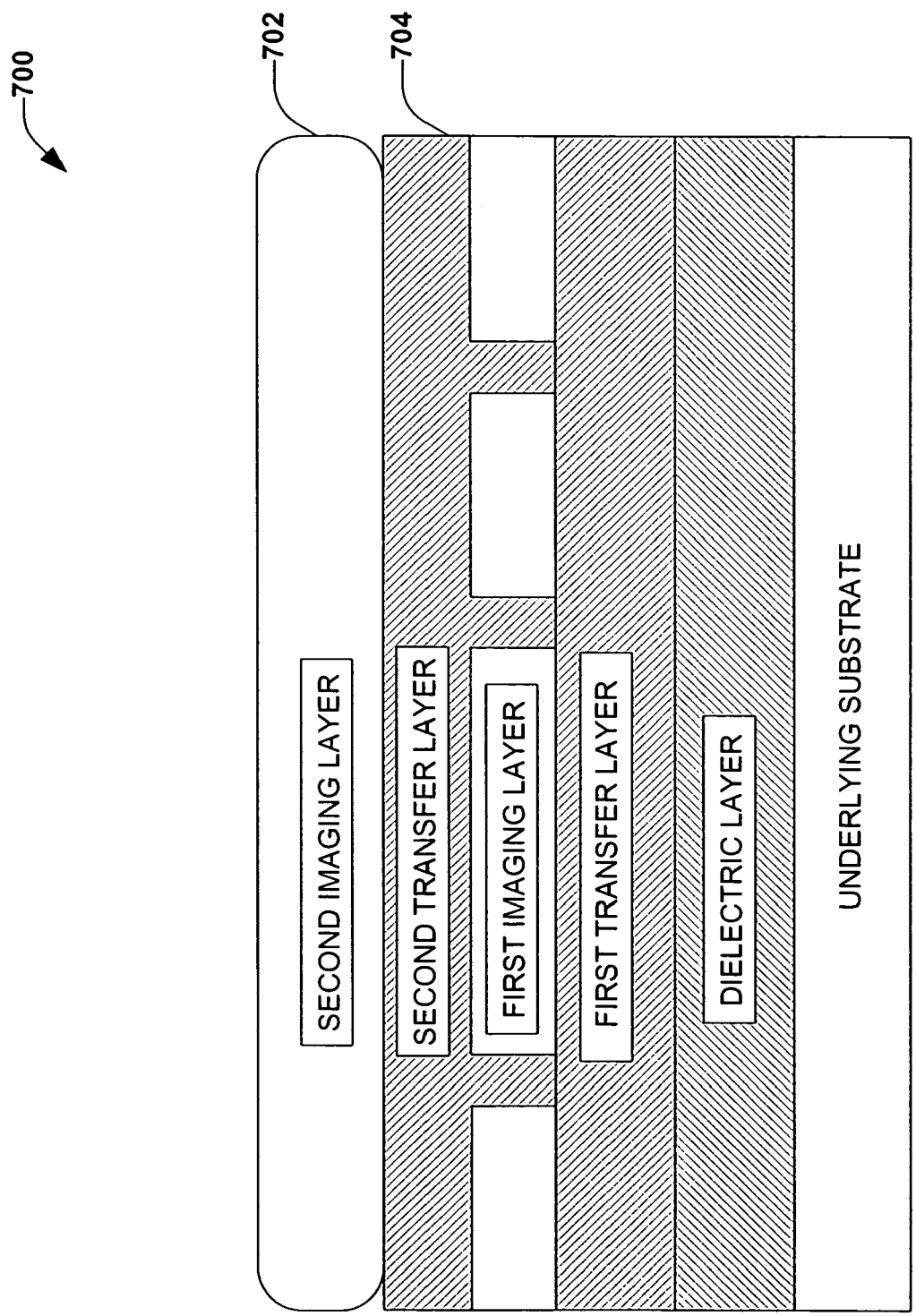
FIG. 7 is an illustration of a substrate after deposition of a second imaging layer in accordance with an aspect of the present invention.

Substrate 600 illustrated in FIG. 6 is comprised of a second transfer layer 602 deposited upon imaging layer 604 which is in turn deposited upon a first transfer layer 606 which is turn deposited upon dielectric layer 608 which is in turn deposited upon underlying substrate 610. When second transfer layer 602 is deposited on imaging layer 604, the via patterns 612 existing in imaging layer 604 are filled with transfer layer material. In order to facilitate integration of the trench portion of the dual damascene pattern, a second low viscosity photopolymerizable organosilicon imagining layer is deposited upon the second transfer layer. FIG. 7 is an illustration of the resulting substrate 700 wherein second imaging layer 702 has been deposited upon second transfer layer 704.

At this point, a second translucent imprint mold is brought into contact with the resulting substrate. In accordance with one aspect of the present invention, the second translucent imprint mold comprises the trench features of the dual damascene pattern. The second translucent imprint mold is brought into contact with the second transfer layer with the second low viscosity, photopolymerizable organosilicon imaging layer filling any gap between the second translucent imprint mold and the second transfer layer. After the second translucent imprint mold is in position, the second imaging layer is exposed through the back of the second translucent imprint mold by ultraviolet light, or other light suitable to cure the photopolymerizable organosilicon. Once exposed, the low viscosity, photopolymerizable, organosilicon cures and creates a solidified, silicon rich replica of the trench features of the dual damascene pattern of the second translucent imprint mold.

Figure 8:
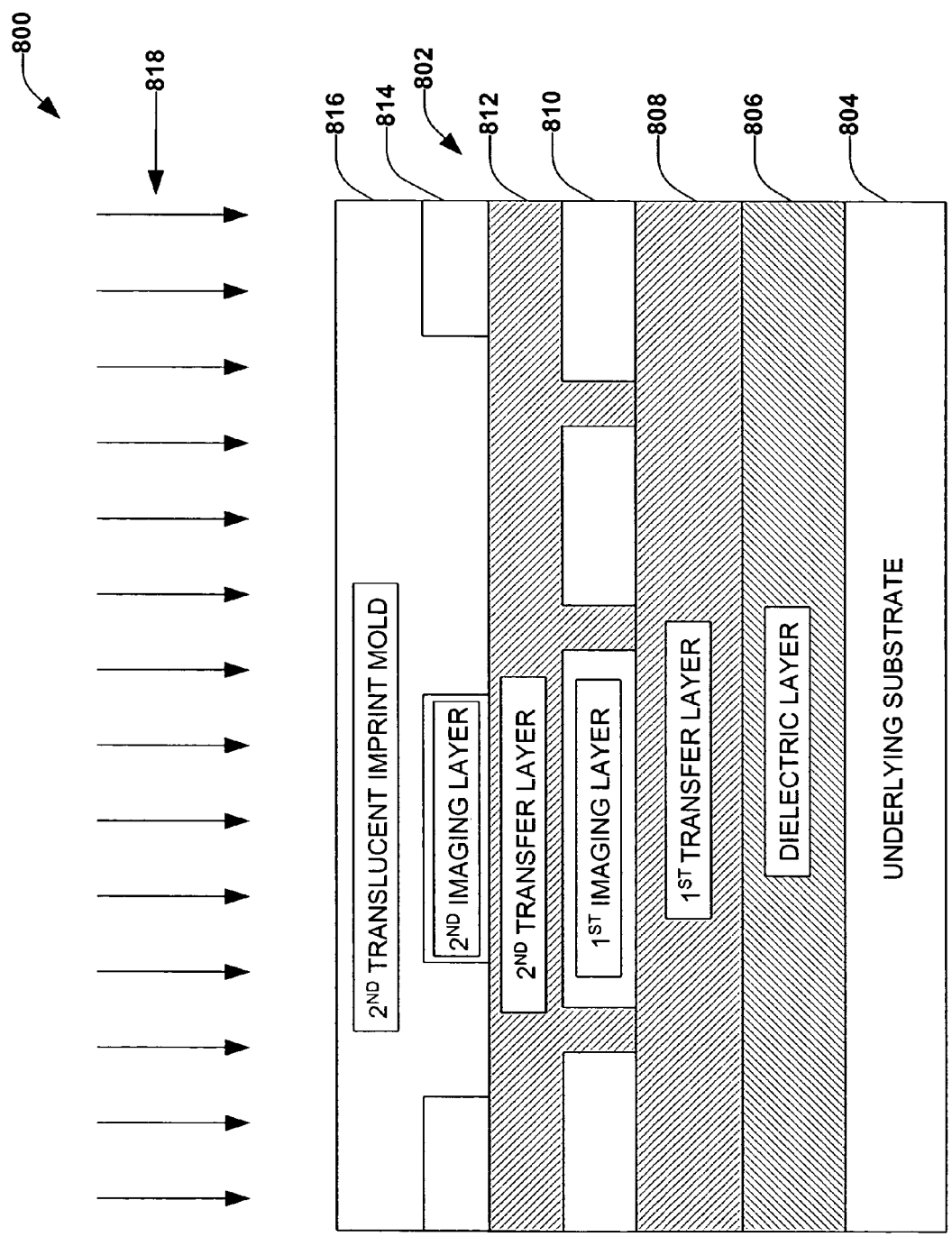
FIG. 8 is an illustration of a substrate prepared for a second imprint and exposure in accordance with an aspect of the present invention.

FIG. 8 is an illustration 800 of a substrate 802 prepared for a second imprint and exposure in accordance with an aspect of the present invention. Referring to FIG. 8, substrate 802 is comprised of underlying substrate 804, dielectric layer 806, first transfer layer 808, first imaging layer 810, and second transfer layer 812. A second imaging layer 814 is deposited upon the second transfer layer 812. Second imaging layer 814 comprising low viscosity, photopolymerizable organosilicon is deposited upon second transfer layer 812. A second translucent imprint mold 816 comprising the trench features of the dual damascene pattern to be imprinted is brought into contact with second transfer layer 812 with second organosilicon imaging layer 814 filling any gap between second translucent imprint mold 816 and second transfer layer 812. Once second translucent imprint mold 816 is properly positioned, an exposure source (not illustrated) provides illumination 818. The exposure source is a source of illumination to which the second photopolymerizable imaging layer 814 is sensitive such as for example ultraviolet light. Illumination 818 passes through second translucent imprint mold 816 to expose the second photopolymerizable imaging layer 814. Once exposed, second imaging layer 814 cures and creates a solidified, silicon rich replica of the trench features of second translucent imprint mold 816.

Figure 9:
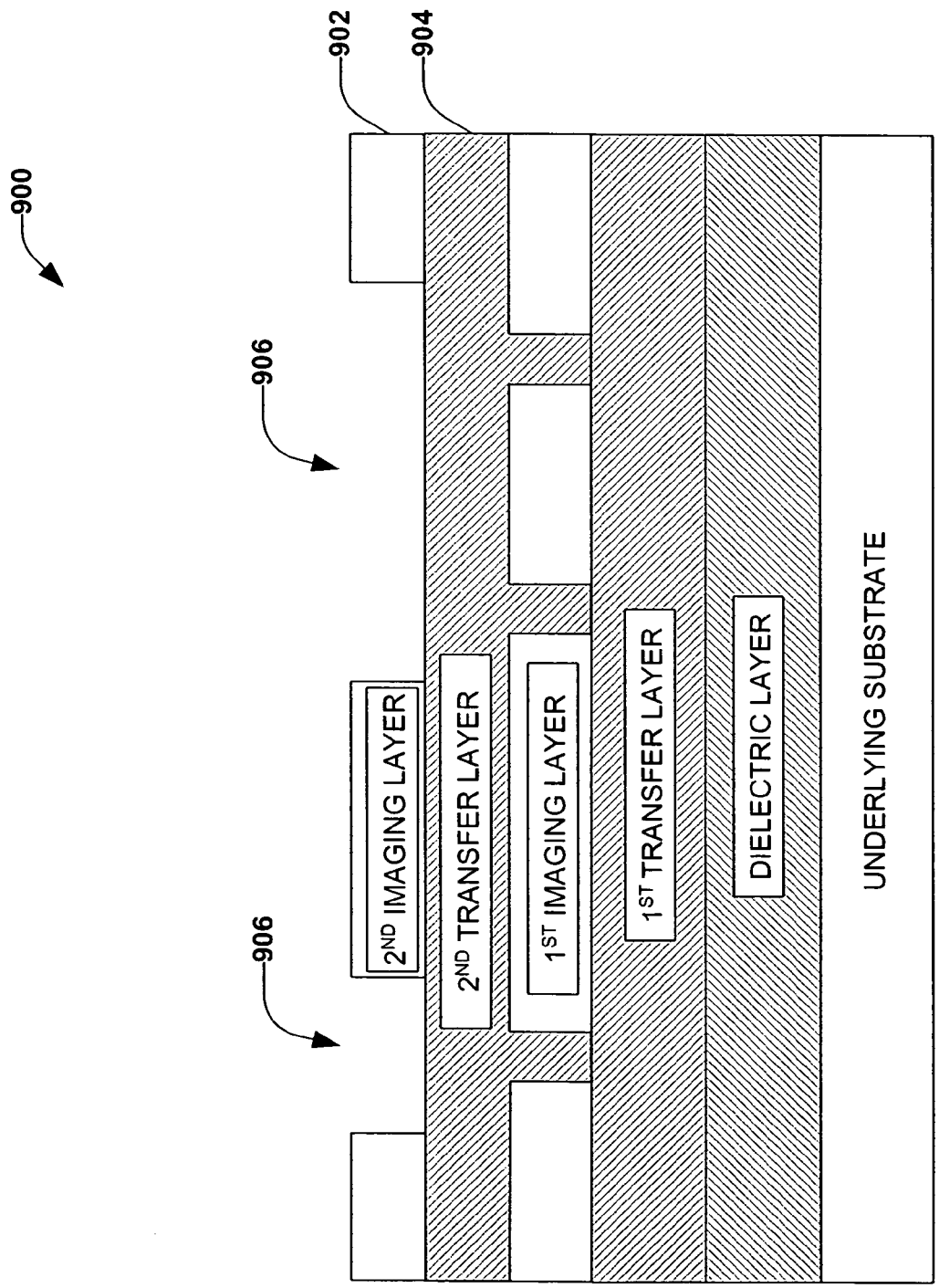
FIG. 9 is an illustration of a substrate after a second imprint and exposure in accordance with an aspect of the present invention.

At this point, second translucent imprint mold 816 is removed and the resulting substrate 900 is illustrated in FIG. 9. Second imaging layer 902 is cured and solidified on top of second transfer layer 904. The pattern for the trench features 906 of the dual damascene pattern are imprinted into solidified second imaging layer 902. In accordance with another aspect of the present invention, once the trench features of the dual damascene pattern have been imprinted in the second imaging layer, the pattern must be transferred to the underlying second transfer layer. In accordance with another aspect of the present invention, the trench pattern in the second imaging layer is transferred into the second transfer layer by a series of plasma etch processes. The first plasma etch is a first halogen breakthrough etch that anisotropically removes residual organosilicon of the second imaging layer to break through to the underlying second transfer layer. During this step, residual portions of the second imaging layer are removed. The residual portions are portions of the second imaging layer remaining where, ideally, all of the low viscosity organosilicon material would have been forced away from between the second translucent imprint layer and the second transfer layer during the imprint process. Such residual imaging layer material might, for example, remain at the bottom surfaces of the trenches 906 illustrated in FIG. 9.

Figure 10:
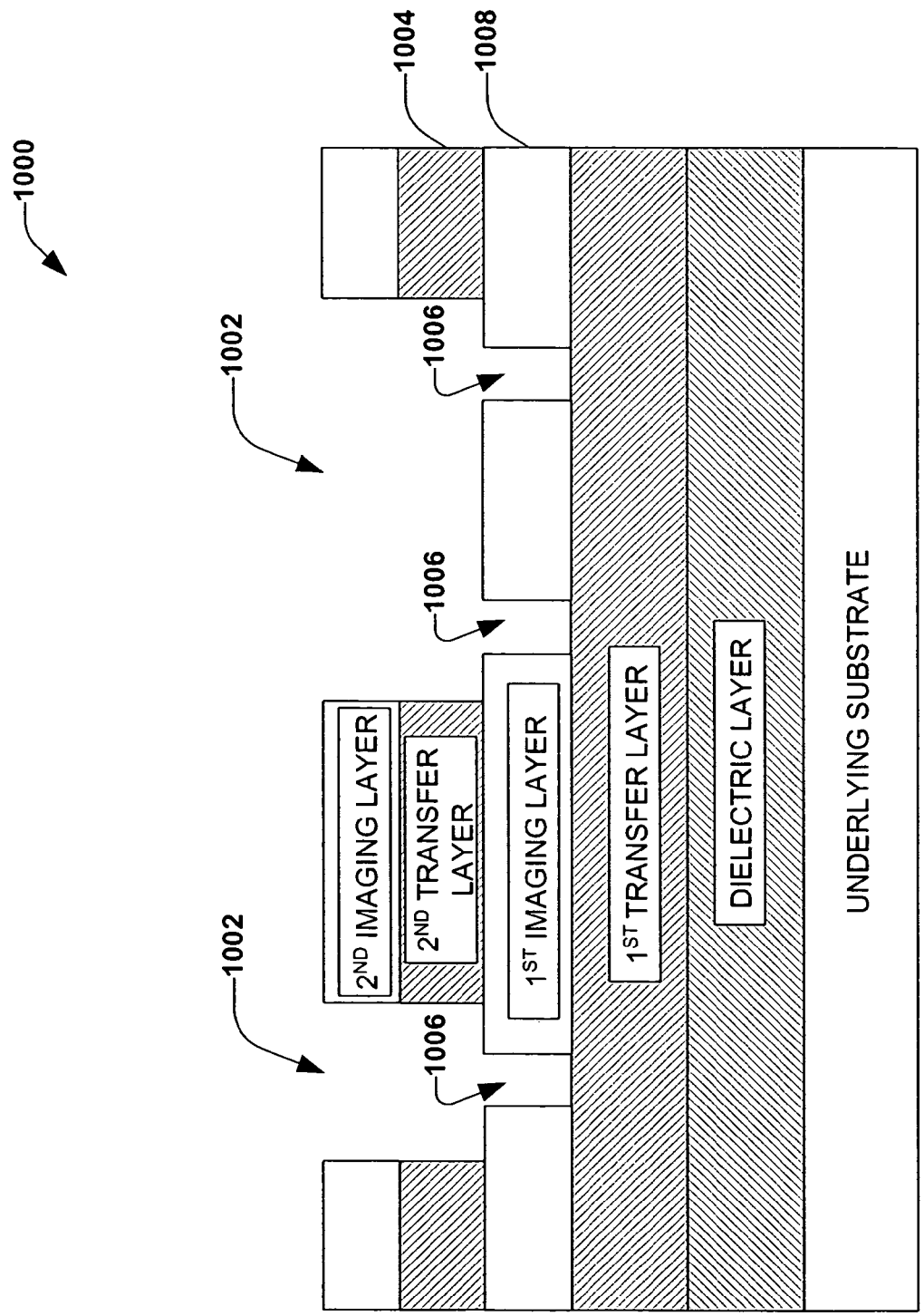
FIG. 10 is an illustration of a substrate after a first halogen breakthrough etch and a first oxygen transfer etch in accordance with an aspect of the present invention.

The second plasma etch process is a first oxygen transfer etch that utilizes the remaining organosilicon material in the second imaging layer as an etch mask to transfer the trench pattern into the underlying second transfer layer. The silicon in the second organosilicon imaging layer and the lack of silicon in the second transfer layer provide the needed etch selectivity between the second imaging layer and the second transfer layer. During this first oxygen transfer etch, the trench portion of the dual damascene pattern is transferred into the second transfer layer. FIG. 10 illustrates the substrate 1000 after completion of the first oxygen transfer etch. In FIG. 10, trenches 1002 have been transferred into the second transfer layer 1004. Furthermore, vias 1006 in first imaging layer 1008 are also etched away.

Figure 11:
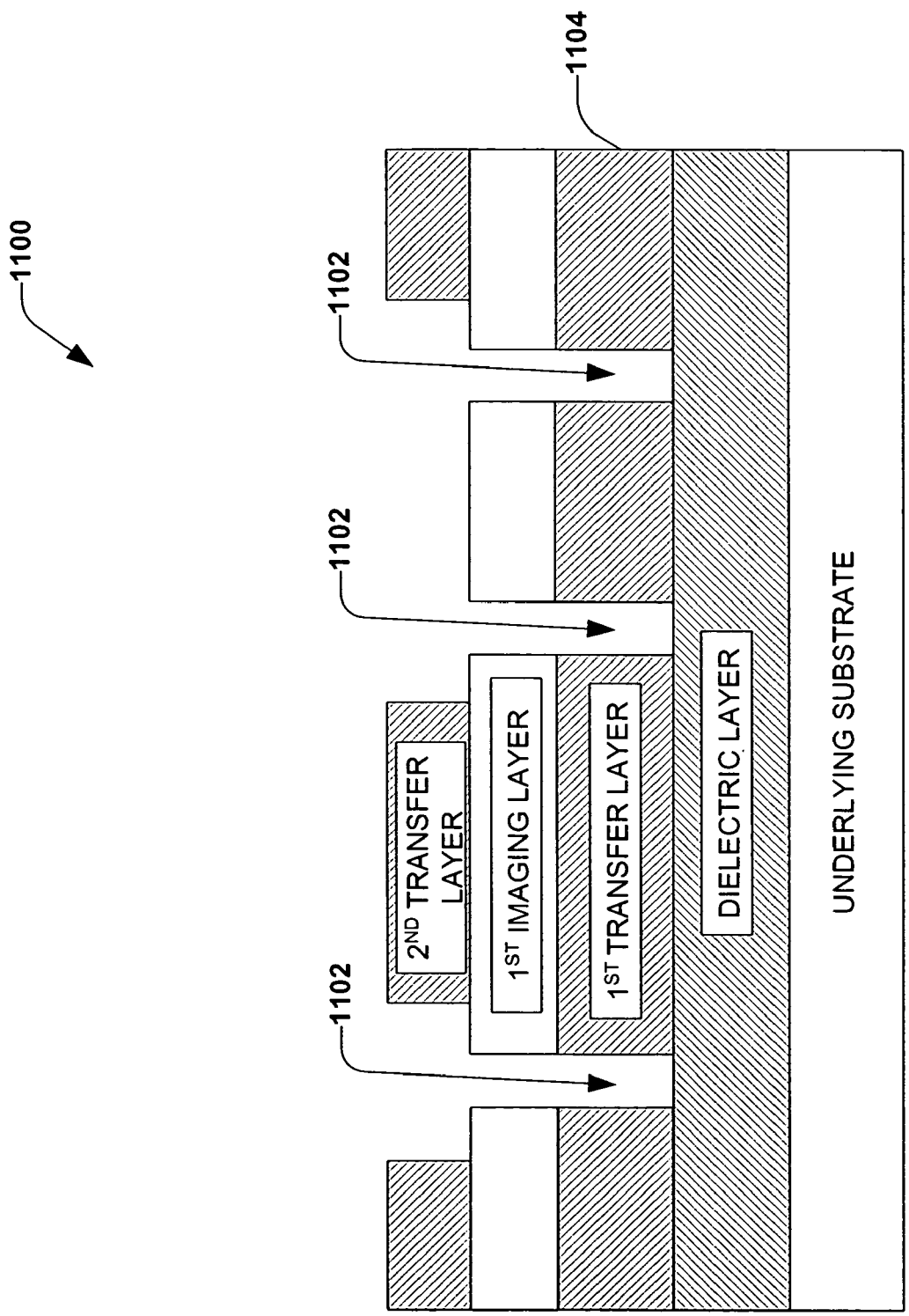
FIG. 11 is an illustration of a substrate after a second halogen breakthrough etch and a second oxygen transfer etch in accordance with an aspect of the present invention.

After completion of the first two etches that transfer the trench pattern into the second transfer layer and removes the transfer material from the via patterns in the first imaging layer, the sequence of a halogen breakthrough etch followed by an oxygen transfer etch is repeated. A halogen etch, (referred to as the second halogen breakthrough etch) removes the remaining portions of the second imaging layer and residual portions of the first imaging layer existing at the bottom of the via patterns. Next, another oxygen etch, (referred to as the second oxygen transfer etch) is performed and the via portion of the dual damascene pattern is transferred into the first transfer layer. The silicon in the first organosilicon imaging layer and the lack of silicon in the first transfer layer provide the needed etch selectivity between the first imaging layer and the first transfer layer. During the second oxygen transfer etch, the via portion of the dual damascene pattern is transferred into the first transfer layer. The resulting substrate 1100 is illustrated in FIG. 11 where the vias 1102 have been transferred into first transfer layer 1104.

Figure 12:
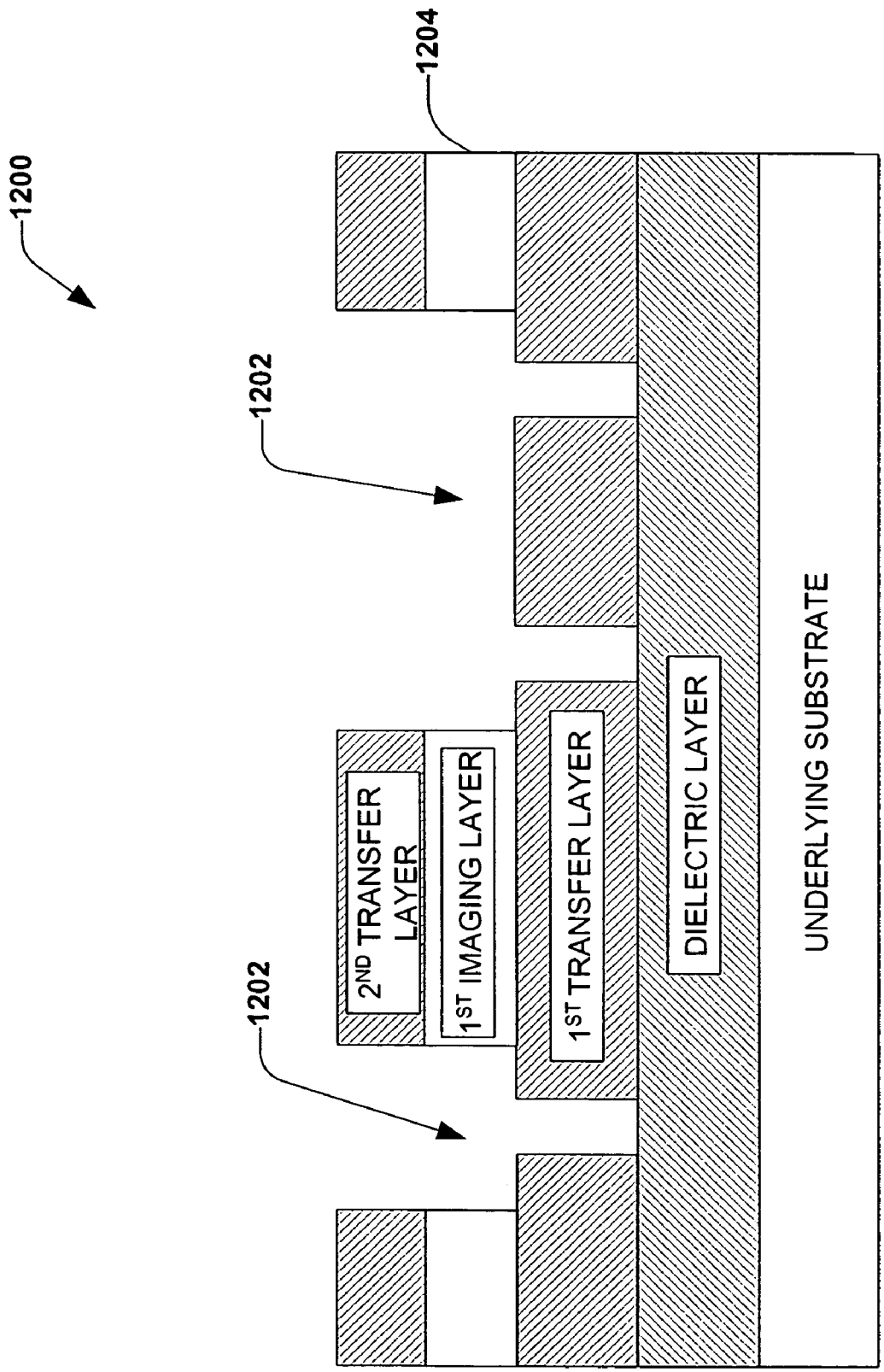
FIG. 12 is an illustration of a substrate after a third halogen breakthrough etch in accordance with an aspect of the present invention.

Next, the trench pattern of dual damascene pattern is transferred from the second transfer layer into the first imaging layer. This is accomplished by a third halogen breakthrough etch. In case the dielectric material is susceptible to attack in the third halogen breakthrough etch, a suitable capping layer of material, such as $SiO_2$ or SiC:H which has low a etch rate in $Cl_2$ plasma for example, may be used immediately above the dielectric layer. The capping material is also desired when the dielectric is susceptible to attack by $O_2$ and needs to be protected from the transfer etch process. The third halogen breakthrough etch exposes the surfaces of the first transfer layer corresponding to the trenches of the dual damascene pattern. The resulting substrate 1200 is illustrated in FIG. 12 where the trenches 1202 have been transferred into first imaging layer 1204. After the transfer of the trenches from the second transfer layer to the first imaging layer is completed, the second transfer layer is removed.

Figure 13:
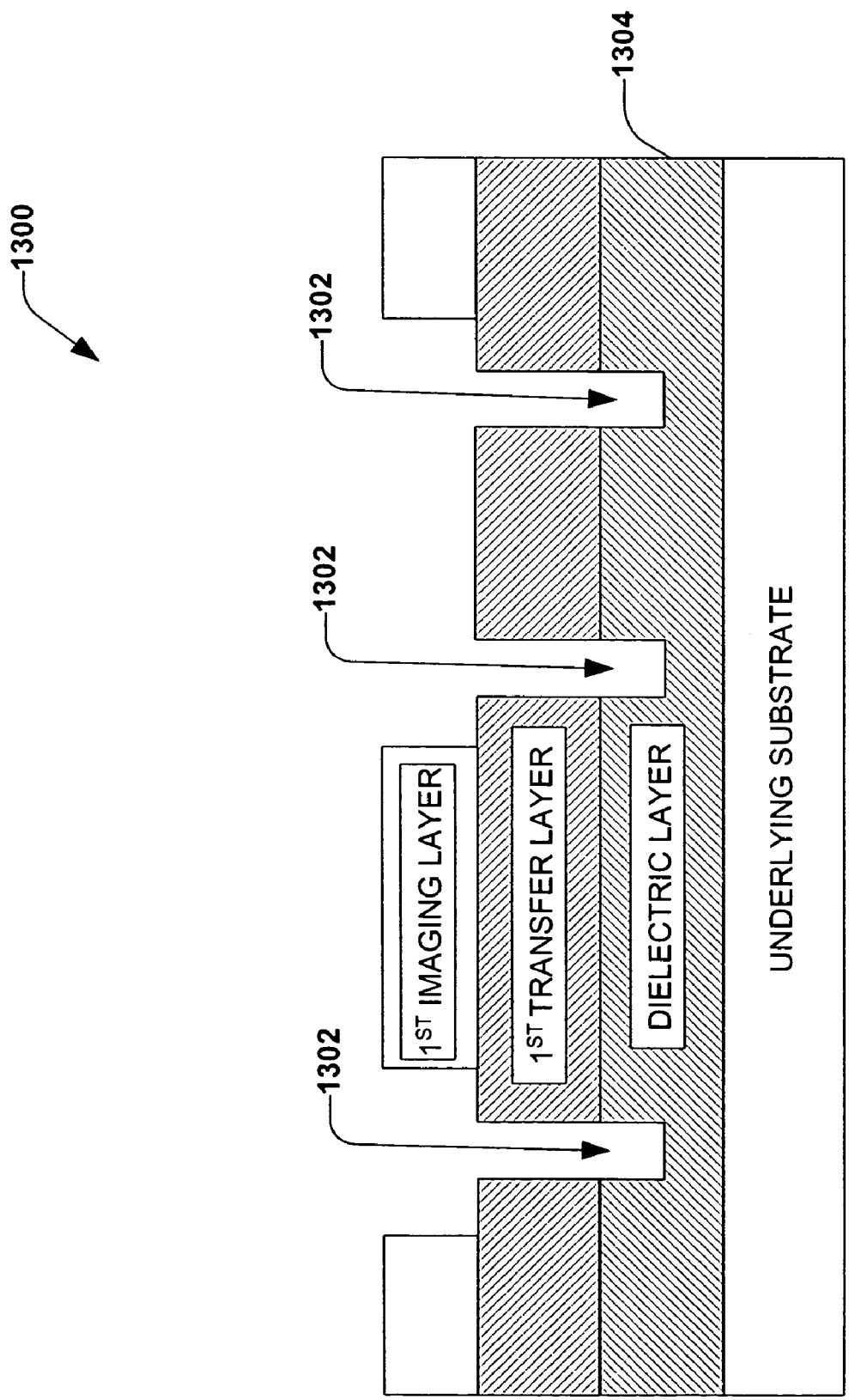
FIG. 13 is an illustration of a substrate after a first dielectric etch in accordance with an aspect of the present invention.

The next action is to transfer the via portion of the dual damascene pattern from the first transfer layer to the dielectric layer. This transfer is accomplished by a first dielectric etch wherein the vias are transferred approximately half way through the dielectric layer (i.e. into the upper portion of the dielectric layer). The depth of the etch, referred to as the depth of penetration, is controlled by controlling and monitoring various parameters of the etching process. FIG. 13 illustrates the resulting substrate 1300 where vias 1302 are transferred into the upper portion of dielectric layer 1304.

Figure 14:
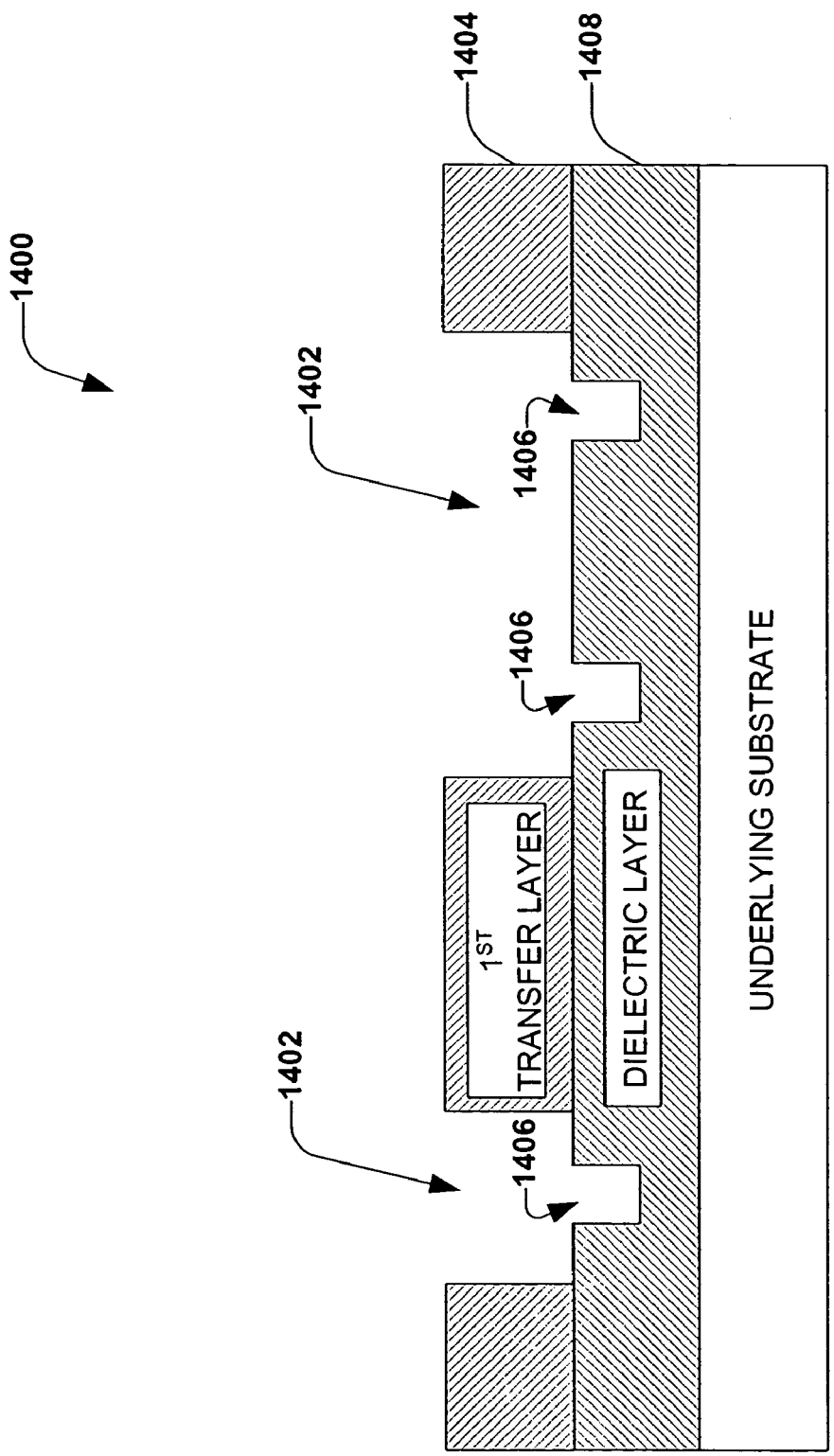
FIG. 14 is an illustration of a substrate after a third oxygen transfer etch in accordance with an aspect of the present invention.

Next the trench pattern is transferred from the first imaging layer to the first transfer layer. This transfer is accomplished by a third oxygen transfer etch that transfers the trench features of the first imaging layer into the first transfer layer. Once completed, the first imaging layer is removed. The resulting substrate 1400 is illustrated in FIG. 14. In FIG. 14 the trench features 1402 of the dual damascene pattern have been transferred into first transfer layer 1404. FIG. 14 also illustrates the via features 1406 in the upper portion of dielectric layer 1408. In case the dielectric material is susceptible to attack in the third oxygen transfer etch, a suitable middle stop layer (commonly used in the art of dual damascene integration) may be inserted in the middle of the dielectric stack at an appropriate depth corresponding to the eventual required trench thickness. This layer may contain of one or more oxygen plasma resistant materials, such as $SiO_2$, SiN, SiC:H etc. Alternately, the third oxygen transfer etch may be allowed to recess the via opening further as deep as the etch step takes it, as long as a suitable bottom stop layer (also well known in the art of dual damascene integration) is present under the dielectric stack. This layer may be impermeable to attack during the oxygen transfer etch and also during the last dielectric etch step to transfer the trench patterns into the top of the dielectric stack. Etch resistant materials such as SiC:H may be used for this purpose.

At this point, an action remains to transfer the trench features of the dual damascene pattern from the first transfer layer into the upper portion of the dielectric layer while simultaneously transferring the via features from the upper portion of the dielectric layer to the lower portion of the dielectric layer. This is accomplished by an appropriate dielectric etch for the chosen dielectric. The dielectric etch process removes appropriate portions of the dielectric layer, simultaneously creating the trench features while lowering the via features. The resulting substrate 1500 is illustrated in FIG. 15 where the complete dual damascene pattern, comprising vias 1502 and trenches 1504, is integrated within dielectric layer 1506.

The next action is to deposit conductive material into the vias and trenches comprising the dual damascene openings in the dielectric layer. Conductive material is deposited over the entire structure, followed by chemical mechanical polishing (CMP) to planarize the structure. Suitable conductive materials include copper, tungsten, gold, silver, aluminum, any alloys and/or combinations thereof. FIG. 16 illustrates the substrate 1600 after deposition of the conductive material 1602 and planarization of the resulting substrate. The substrate is now ready for additional layers to be created on top of the dual damascene interconnect features.

Referring now to FIG. 17, a high level block diagram of a system 1700 for integrating a dual damascene interconnect pattern with two imprint acts in accordance with an aspect of the present invention is illustrated. The system comprises via feature imprint mold 1702, trench feature imprint mold 1704, coated substrate 1706, imprint process component 1708, etch process component 1710, layer deposition component 1712 and metal fill process component 1714. Via feature imprint mold 1702 comprises one or more via features of the dual damascene pattern and trench feature imprint mold 1704 comprises one or more trench features of the dual damascene pattern. Via feature imprint mold 1702 and trench feature imprint mold 1704 are comprised of translucent quartz, however it is understood that each mold may be comprised of any translucent material suitable for imprinting the desired pattern, such as, for example, silicon dioxide, fused quartz, etc.

Coated substrate 1706 comprises an underlying substrate 1716, a dielectric layer 1718, and a transfer layer 1720. Underlying substrate 1716 includes any and all layers and structures fabricated in the semiconductor substrate up to this point of processing. Underlying substrate 1716 may include one or more structures such as active elements and passive elements including polysilicon gates, wordlines, source regions, drain regions, bit lines, bases, emitters, collectors, conductive lines, conductive plugs, diffusion regions, etc.

Dielectric layer 1718 is the layer into which the dual damascene interconnect pattern is to be integrated. Dielectric layer 1718 includes dielectric material or insulating material including silicon based dielectric materials, silicates, and low k material. Silicon based dielectric materials include silicon dioxide, silicon nitride and silicon oxynitride. Silicates include fluorine doped silicon glass (FSG), tetraethylorthosilicate (TEOS), borophosphotetraethylorthosilicate (BPTEOS), phosphosilicate glass (PSG), borophosphosilicate glass (BPSG), and other suitable spin-on glass.

Low k polymer materials include one or more of polyimides, fluorinated polyimides, polysilsequioxane, benzocyclobutene (BCB), poly(arylene ester), parylene F, parylene N and amorphous polytetrafluoroethylene. Specific examples of a commercially available low k materials include those under the trade designations Flare™ from AlliedSignal, believed to be derived from perfluorobiphenyl and aromatic bisphenols; Black Diamond™ from Applied Materials; ALCAP-S from Asahi Chemical; SiLK® and Cyclotene® BCB from Dow Chemical; Teflon® polytetrafluoroethylene from DuPont; XLK and 3MS from Dow Corning; HSG RZ25 from Hitachi Chemical; HOSP™ and Nanoglass™ from Honeywell Electronic Materials; LKD from JSR Microelectronics; CORAL™ and AF4 from Novellus; mesoporous silica from Battelle PNNL; and Velox™ PAE-2 from Schumacher.

First transfer layer 1720 facilitates the transfer of the dual damascene pattern from imprint molds 1702 and 1704 to dielectric layer 1718. In accordance with one aspect of the present invention, first transfer layer 1720 comprises organic material, spin coated or otherwise deposited onto dielectric layer 1718. Ideal transfer layer materials adhere to the dielectric layer and to a subsequently deposited imaging layer. Transfer layer 1720 provides high etch rate selectivity when subjected to subsequent etch processes that facilitate transfer of the dual damascene pattern. Conventional photoresists such as HR 100 from OLIN are suitable materials for the transfer layer.

Layer deposition component 1712 deposits low viscosity, photopolymerizable organosilicon imaging layers and transfer layers at the appropriate times onto coated substrate 1706. Etch process component 1710 controls and performs various etches required to create and transfer patterns from one layer to another. Layer deposition component 1712 deposits first imaging layer 1722 upon first transfer layer 1720 of coated substrate 1706. This first imaging layer may be deposited immediately before an imprint step in a step and repeat process or may alternatively be spin coated or otherwise deposited across the entire first transfer layer 1720 prior to imprint process component 1708 imprinting the via feature pattern utilizing via feature imprint mold 1702. Imprint process component 1708 comprises components which control and effectuate a contact process and a subsequent exposure process. Imprint process component 1708 brings via feature imprint mold 1702 into contact with first transfer layer 1720 with organosilicon imaging layer 1722 filling any gap between via imprint mold 1702 and first transfer layer 1720. First imaging layer 1722 is then exposed to a flood of ultraviolet light from imprint process component 1708. The ultraviolet light exposes and cures the first imaging layer 1722. After exposure, the cured first imaging layer contains a replica of the via features of via feature imprint mold 1702. Imprint process component 1708 then separates via imprint mold 1702 from cured organosilicon imaging layer 1722.

After via imprint mold 1702 is separated from imaging layer 1722, layer deposition component 1712 deposits second transfer layer 1724 upon first imaging layer 1722. Second transfer layer 1724 provides high etch rate selectivity when subjected to subsequent etch processes that facilitate transfer of the dual damascene pattern. The next action comprises layer deposition component 1712 depositing a second imaging layer 1726 upon second transfer layer 1724. The second imaging layer may be deposited immediately before an imprint step in a step and repeat process or may alternatively be spin coated or otherwise deposited across the entire second transfer layer prior to imprint process component 1708 imprinting the trench feature pattern utilizing trench feature imprint mold 1704. Imprint process component 1708 brings trench feature imprint mold 1704 into contact with second transfer layer 1724 with second organosilicon imaging layer 1726 filling any gap between trench imprint mold 1704 and second transfer layer 1724. Second imaging layer 1726 is then exposed to a flood of ultraviolet light from imprint process component 1708. The ultraviolet light exposes and cures the second imaging layer 1726. After exposure, the cured second imaging layer contains a replica of the trench features of trench feature imprint mold 1704. Imprint process component 1708 then separates the trench imprint mold from the second imaging layer.

At this point, the via features of the dual damascene pattern have been imprinted in the first imaging layer 1722 and the trench features of the dual damascene pattern have been imprinted in the second imaging layer 1726 of the coated substrate. Etch process component 1710 effectuates a sequence of halogen breakthrough etches, oxygen transfer etches, and dielectric etches that effectuate, as previously described herein, the transfer of the via and trench patterns in the first and second cured organosilicon imaging layers into dielectric layer 1718. Following the sequence of etches, dielectric layer 1718 comprises the desired dual damascene pattern.

Metal fill process component 1714 comprises the necessary components to fill the dual damascene vias and trenches in dielectric layer 1718 with an appropriate metal fill, such as for example copper, tungsten, gold, silver, aluminum, any alloys and/or combinations thereof and subsequently to planarize the resulting substrate.

Figure 18:
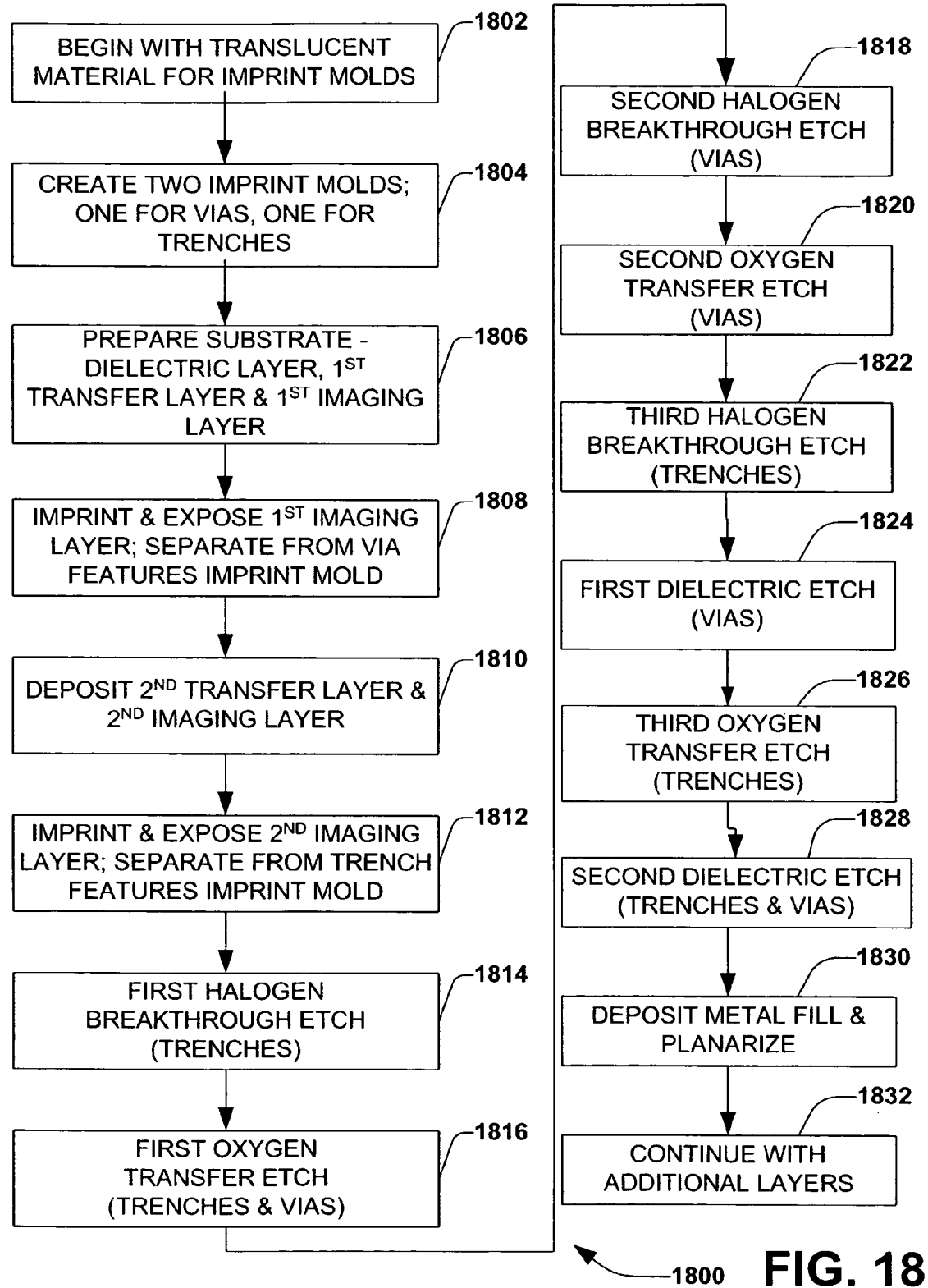
FIG. 18 is an illustration of a methodology to facilitate integration of a dual damascene pattern with two imprint acts in accordance with an aspect of the present invention.

In view of the exemplary systems shown and described above, methodology 1800 which may be implemented in accordance with the present invention, will be better appreciated with reference to the flow diagram illustrated in FIG. 18. While, for purposes of simplicity of explanation, methodology 1800 is shown and described as a series of function blocks, it is to be understood and appreciated that the present invention is not limited by the order of the blocks, as some blocks may, in accordance with the present invention, occur in different orders and/or concurrently with other blocks from that shown and described herein. Moreover, not all illustrated blocks may be required to implement a methodology in accordance with the present invention. It is to be appreciated that the various blocks may be implemented via software, hardware, a combination thereof, or any suitable means (e.g., device, system, process, component, etc.) for carrying out the functionality associated with the blocks. It is also to be appreciated that the blocks are merely to illustrate certain aspects of the present invention in a simplified form and that these aspects may be illustrated via a lesser and/or greater number of blocks.

FIG. 18 is an illustration of a methodology 1800 to facilitate integration of a dual damascene pattern with two imprint acts. Referring to FIG. 18, methodology 1800 begins at 1802 with translucent material suitable for imprint lithography. At 1804, the translucent material is processed to create two translucent imprint molds; one mold, a via feature imprint mold is for the via features of the dual damascene pattern and the other mold, a trench feature imprint mold is for the trench features of the dual damascene pattern. The translucent imprint molds are created by a series of lithographic exposures and etches suitable for the material comprising the mold. The resulting imprint molds comprise a three dimensional representation of the vias and trenches of the dual damascene pattern to be transferred.

The methodology continues at 1806 where a substrate is prepared for imprint with the via feature imprint mold. The substrate is prepared by creating a suitable dielectric layer, a first transfer layer and a first imaging layer upon an underlying substrate. The dielectric layer is the layer into which the dual damascene pattern will ultimately be integrated. The dielectric layer includes dielectric material or insulating material including silicon based dielectric materials, silicates, and low k material. Silicon based dielectric materials include silicon dioxide, silicon nitride and silicon oxynitride. Silicates include fluorine doped silicon glass (FSG), tetraethylorthosilicate (TEOS), borophosphotetraethylorthosilicate (BPTEOS), phosphosilicate glass (PSG), borophosphosilicate glass (BPSG), and other suitable spin-on glass.

Low k polymer materials include one or more of polyimides, fluorinated polyimides, polysilsequioxane, benzocyclobutene (BCB), poly(arylene ester), parylene F, parylene N and amorphous polytetrafluoroethylene. Specific examples of a commercially available low k materials include those under the trade designations Flare™ from AlliedSignal, believed to be derived from perfluorobiphenyl and aromatic bisphenols; Black Diamond™ from Applied Materials; ALCAP-S from Asahi Chemical; SiLK® and Cyclotene® BCB from Dow Chemical; Teflon® polytetrafluoroethylene from DuPont; XLK and 3MS from Dow Corning; HSG RZ25 from Hitachi Chemical; HOSP™ and Nanoglass™ from Honeywell Electronic Materials; LKD from JSR Microelectronics; CORAL™ and AF4 from Novellus; mesoporous silica from Battelle PNNL; and Velox™ PAE-2 from Schumacher.

A first transfer layer is then deposited upon the dielectric layer. In accordance with one aspect of the present invention, the first transfer layer facilitates transferring a pattern from the first imaging layer to the dielectric layer. The first transfer layer comprises organic material, spin coated or otherwise deposited onto the dielectric layer. Ideal transfer layer materials adhere to the dielectric layer and to a subsequently deposited imaging layer. The first transfer layer provides high etch rate selectivity when subjected to subsequent etch processes that facilitate the transfer of the desired dual damascene pattern. Conventional photoresists such as for example HR 100 from OLIN are suitable materials for the first transfer layer.

After the first organic transfer layer is spin coated or otherwise deposited upon the dielectric layer, a first imaging layer comprising low viscosity, photopolymerizable, organosilicon is deposited upon the first transfer layer.

Once the substrate has been prepared, the methodology continues at 1808. At 1808 the via feature imprint mold is brought into contact with the prepared substrate with the organosilicon of the first imaging layer filling any gap between the via feature imprint mold and the first transfer layer. After the via feature imprint mold is in position, the low viscosity, photopolymerizable, organosilicon is exposed through the back of the translucent imprint mold by ultraviolet light, or other light suitable to cure the photopolymerizable, organosilicon, first imaging layer. Once exposed, the low viscosity, photopolymerizable, organosilicon cures and creates a solidified, silicon rich replica of the via features of the via feature imprint mold. The via feature imprint mold is then separated from the cured first imaging layer.

At 1810, a second transfer layer is deposited upon the first imaging layer and then a second imaging layer is deposited upon the second transfer layer. The transfer layer comprises organic material, spin coated or otherwise deposited onto the dielectric layer. The second transfer layer provides high etch rate selectivity when subjected to subsequent etch processes that facilitate the transfer of the desired dual damascene pattern. After the second transfer layer is spin coated or otherwise deposited upon the first imaging layer, a second imaging layer comprising low viscosity, photopolymerizable, organosilicon is deposited upon the second transfer layer.

Once the substrate has been prepared with the second transfer layer and second imaging layer, the methodology continues at 1812. At 1812 the trench feature imprint mold is brought into contact with the prepared substrate with the organosilicon of the second imaging layer filling any gap between the trench feature imprint mold and the second transfer layer. After the trench feature imprint mold is in position, the low viscosity, photopolymerizable, organosilicon is exposed through the back of the translucent imprint mold by ultraviolet light, or other light suitable to cure the photopolymerizable, organosilicon, second imaging layer. Once exposed, the low viscosity, photopolymerizable, organosilicon cures and creates a solidified, silicon rich replica of the trench features of the trench feature imprint mold. The trench feature imprint mold is then separated from the cured second imaging layer.

At 1814, a first halogen breakthrough etch is performed which removes any residual portion of the second imaging layer remaining from between the trench features of the trench feature imprint mold and the second transfer layer. The first breakthrough etch exposes portions of the second transfer layer corresponding to the trench features. After the appropriate areas of the second transfer layer are exposed, a first oxygen transfer etch is performed at 1816 which transfers the trench portion of the dual damascene pattern from the second imaging layer into the second transfer layer.

This first oxygen etch also removes the portions of the second transfer layer filling the vias imprinted in the first imaging layer.

After transfer of the trench features into the second transfer layer and removal of the transfer material from the via features of the first imaging is complete, a second halogen breakthrough etch is performed at 1818. The second halogen etch removes the portions of the first imaging layer corresponding to the via features of the dual damascene pattern, exposing corresponding portions of the first transfer layer. The second halogen breakthrough etch is followed by a second oxygen transfer etch at 1820 which transfers the via feature of the dual damascene pattern from the first imaging layer into the first transfer layer.

The next action is at 1822 where a third halogen breakthrough etch is performed. This third halogen breakthrough etch removes portion of the first imaging layer corresponding to the trenches of the dual damascene pattern and exposes the corresponding portions of the first transfer layer. At 1824 a first dielectric etch is performed that transfers the via features from the first transfer layer into the upper portion of the dielectric layer. The dielectric etch stops when the via features are approximately half way through the dielectric layer.

At 1826 a third oxygen transfer etch is performed that transfers the trench portion of the dual damascene pattern from the first imaging layer into the first transfer layer. At 1828 a second dielectric etch is performed that simultaneously transfers the trench features of the dual damascene pattern from the first transfer layer to the upper portion of the dielectric layer and transfers the via features of the dual damascene pattern from the upper portion of the dielectric layer to the lower portion of the dielectric layer.

At 1830 a conductive material is deposited in the vias and trenches of the dual damascene openings of the dielectric layer. Suitable conductive materials include copper, tungsten, gold, silver, aluminum, any alloys and/or combinations thereof. Conductive material is deposited over the entire structure, followed by chemical mechanical polishing (CMP) to planarize the structure and complete integration of the dual damascene pattern into the dielectric layer. At 1832 the methodology continues with the processing necessary to fabricate additional layers on top of the dielectric layer comprising the dual damascene pattern.

Figure 19:
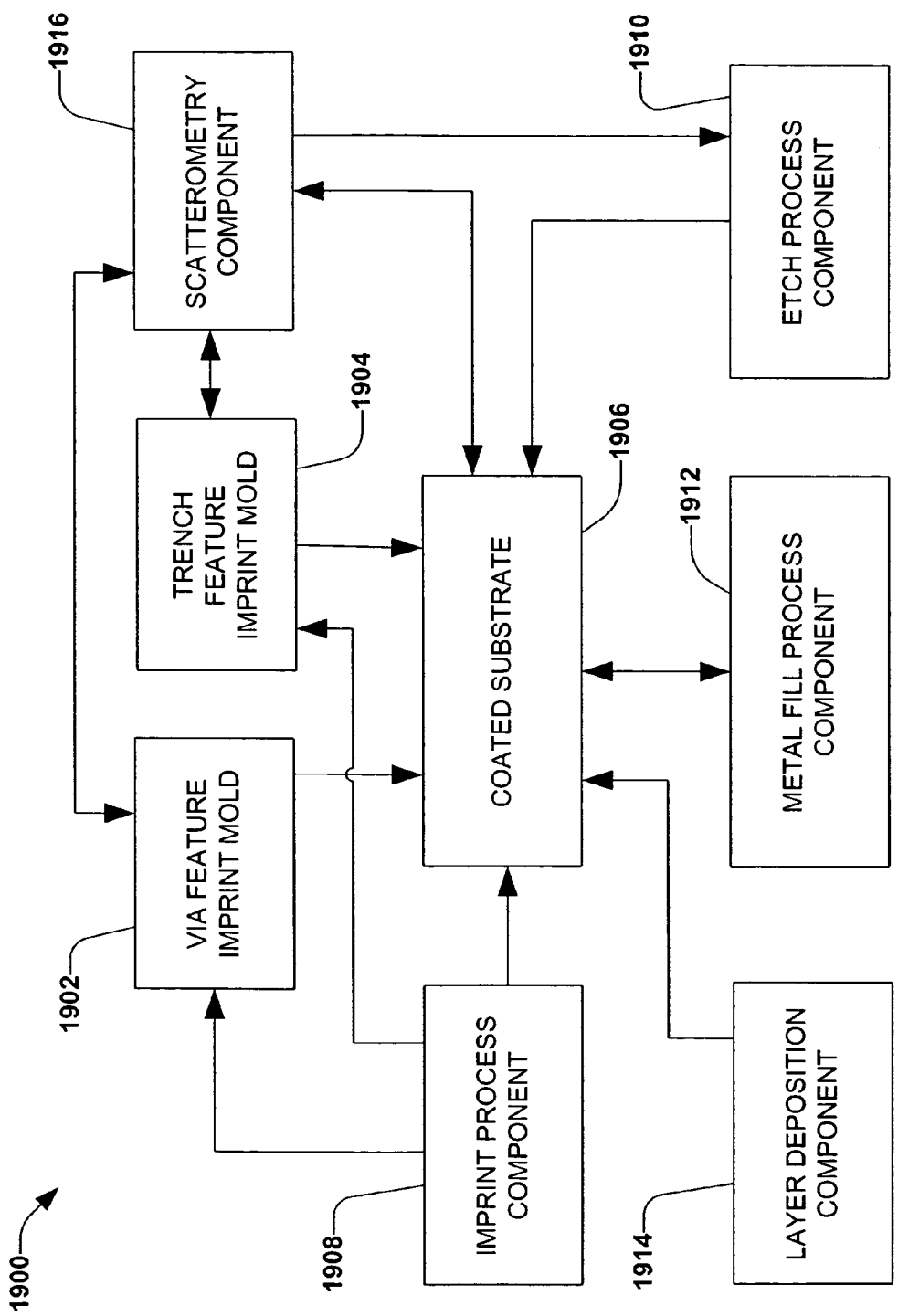
FIG. 19 is an illustration of another exemplary system for integrating dual damascene interconnect patterns with two imprint acts in accordance with an aspect of the present invention.

FIG. 19 is an illustration of another exemplary system 1900 in accordance with an aspect of the present invention. In accordance with this aspect of the present invention, scatterometry techniques are used to monitor and control the formation of the dual damascene structure at one or more steps in the process. The system of FIG. 19 comprises via feature imprint mold 1902, trench feature imprint mold 1904, coated substrate 1906, imprint process component 1908, etch process component 1910, metal fill process component 1912, layer deposition component 1914 and scatterometry component 1916.

Scatterometry is a technique for extracting information about a surface upon which an incident light has been directed. Information concerning properties including, but not limited to, dishing, erosion, profile, chemical composition, thickness of thin films and critical dimensions of features present on a surface such as a substrate or substrate coating can be extracted. The wavelength, intensity and/or the phase of a reflected and/or diffracted beam of light will change based on properties of the surface upon which the light is directed. Information can be extracted by evaluating the wavelength, phase and/or intensity of light received at various locations of a detector. In accordance with one aspect of the present invention, scatterometry techniques are used to monitor and/or control the formation of vias and/or trenches in one or more of the imaging layers, transfer layers, and dielectric layer. In accordance with another aspect of the present invention, scatterometry is utilized to evaluate the features of the via feature imprint mold and the trench feature imprint mold.

The presence of dual damascene patterns on a surface of a substrate will have varying effects on the wavelength, intensity and/or phase of light reflected/diffracted off the surface of the substrate depending upon the position of the dual damascene vias and trenches (i.e. features) and the depth of penetration of the features into the surface layer. As used in this application, the wavelength, intensity, and phase of a light are referred to as characteristics of the light. Analysis by scatterometry or other similar techniques reveals a substantially unique set of characteristics for a given condition of a surface. The unique set of characteristics is referred to as an optical signature. When the reflected and/or diffracted beams are analyzed by scatterometry, a signature generated as a result of the detected location, wavelength, intensity, phase, etc. can be pattern matched, for example, to a library of signatures to determine whether the observed optical signature corresponds to a reference optical signature stored within the signature library. The signature library can be populated from prior observed optical signatures and/or optical signatures generated by modeling and simulation. Thus, in accordance with an aspect of the present invention, a determination can be made concerning the dual damascene patterns on a substrate by pattern matching an observed optical signature to a library of optical signatures. For example, the depth of penetration of the features in a layer can be determined by pattern matching an observed optical signature to a library of optical signatures. In accordance with another aspect of the present invention, one or more etching processes are controlled based at least in part on results from pattern matching an observed signature to a library of optical signatures.

A signature for known ideal conditions associated with a particular pattern on a particular layer of a substrate at a particular point in a process can be observed and stored in a signature library within a data store or memory. In accordance with one aspect of the present invention, this known good signature is used as a reference signature against which actual observed signatures are compared. Similar signatures may be observed for known incomplete processing conditions such as for example insufficient depth of penetration resulting from a dielectric etch of a via pattern into a dielectric layer.

In accordance with another aspect of the present invention, simulation and modeling can be employed to produce signatures for the library against which observed signatures can be matched. For example, for a given dual damascene pattern, a simulation can provide an expected optical signature that should be generated when etching of the via pattern into the dielectric layer is optimal. Similarly, through simulation and modeling, an expected signature can be produced for insufficient etching, over etching, and a range of acceptable depths of penetration for any particular pattern in any given layer associated with any given etching process. In accordance with another aspect of the present invention, optical signatures obtained through simulation and modeling can be combined with prior observed optical signatures to form the signature library. In accordance with another aspect of the present invention, by matching a real-time observed optical signature to a known condition reference optical signature produced either by actual observation or through simulation and modeling, the condition of the dual damascene pattern on a surface of a substrate can be determined. In accordance with yet another aspect of the present invention, a system can determine whether to alter an etching process, based at least in part upon such information.

Figure 20:
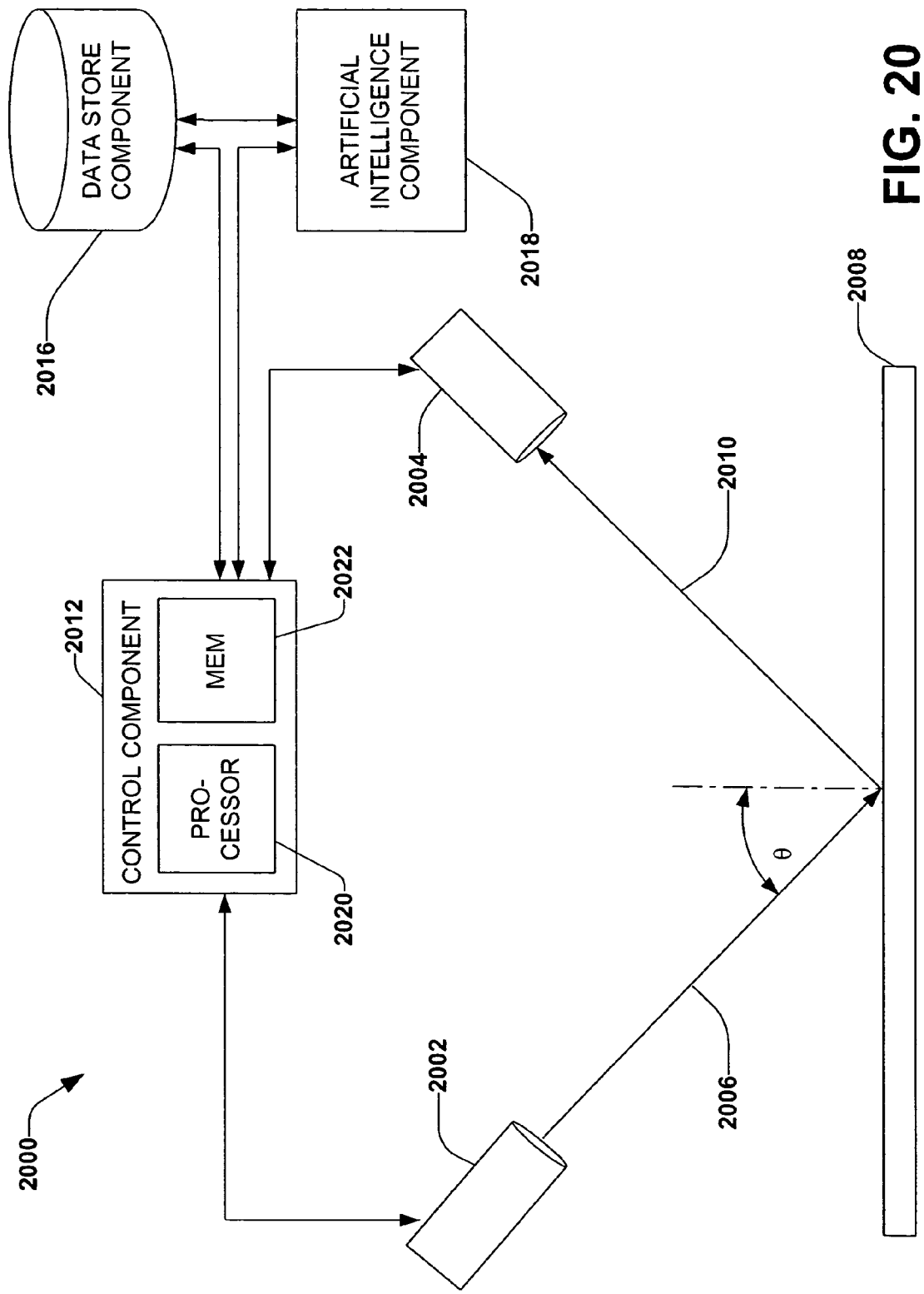
FIG. 20 is an illustration of a scatterometry component in accordance with an aspect of the present invention.

FIG. 20 is an illustration of a scatterometry component 2000 in accordance with an aspect of the present invention. Scatterometry component 2000 is comprised of light source 2002, such as one or more optical emitters, and detector 2004 such as one or more optical detectors. Light source 2002 is the source of incident light beam 2006 emitted toward substrate 2008 at an incident angle θ relative to a normal reference line. Light source 2002 is a frequency stabilized laser; however it is understood that any suitable light source (e.g., laser diode, or helium neon (HeNe) gas laser, halogen lamp, mercury lamp, UV light source, E-UV light source, etc.) can be utilized in connection with the present invention. At least a portion of incident beam 2006 is reflected and/or diffracted off substrate 2008 as reflected/diffracted beam 2010.

One or more optical detectors 2004 receive the reflected/diffracted beam 2010 and further operate to determine characteristics (i.e. wavelength, phase, intensity) of the light reaching the detectors. Information can be extracted from the light reaching the optical detectors about the surface of the substrate from which the light is reflected and/or diffracted. In accordance with one aspect of the present invention, scatterometry techniques are applied to light that is reflected and/or diffracted off of one or more of the imaging layers, the transfer layers, and the dielectric layer.

Optical detector 2004 includes a spectrometer or other instrument capable of providing spectrally-resolved information concerning the reflected/diffracted beam 2010. The portion of the reflected/diffracted beam 2010 that enters optical detector 2004 for analysis is determined at least in part by the reflection/diffraction characteristics of substrate 2008 along with properties of optical detector 2004 and any associated optical elements used in conjunction with optical detector 2004.

Optical detector 2004 collects light that is reflected and/or diffracted by the dual damascene features of substrate 2008. Scatterometry component 2000 can be utilized to determine the dimensions, including the depth of penetration, of dual damascene features in the substrate surface by comparing wavelength, phase and/or intensity of the light received at various locations within optical detector 2004 to known set of reference wavelength, phase and/or intensity characteristics at corresponding locations within optical detector 2004. The location, wavelength, intensity and/or phase of the reflected and/or diffracted light received at various locations of optical detector 2004 constitute an optical signature. The optical signature received by the detector 2004 will change based on the dimensions of the features on the substrate surface 2008. Known optical signatures for known dimensions, locations, etc. for a given dual damascene pattern may be stored in data store component 2016 for comparison to an observed optical signature.

Scatterometry component 2000 further comprises control component 2012, data store component 2016 and artificial intelligence component 2018. Control component 2012 further comprises processor 2020 and memory 2022. Processor 2020 may be any of a plurality of processors, such as the AMD K7, the AMD Athlon™, the AMD Duron™, and other similar and/or compatible processing units. Control component 2012 may be programmed to control and operate the various components in order to carry out the various functions described herein.

Memory 2022 stores program code executed by processor 2020 for carrying out operating functions. Memory 2022 also serves as a storage medium for temporarily storing information. By way of illustration and not limitation, the memory 2022 can hold patterns or optical signatures or other data to which observed (measured) data can be compared. Memory 2022 also serves as a storage medium for temporarily storing data such as trench etch process parameters, measured wafer and/or layer dimensions, trench etch process progress values, trench etch process progress tables, component coordinate tables, wafer and/or layer shapes and sizes, scatterometry information, achieved wafer and/or layer dimensions, desired wafer and/or layer dimensions as well as other data that may be employed to facilitate the performance of the present invention.

Memory 2022 can be volatile memory or nonvolatile memory, or can comprise both volatile and nonvolatile memory. By way of illustration, and not limitation, nonvolatile memory can comprise read only memory (ROM), programmable ROM (PROM), electrically programmable ROM (EPROM), electrically erasable ROM (EEPROM), or flash memory. Volatile memory can comprise random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM). The memory of the present systems and methods is intended to comprise, without being limited to, these and any other suitable types of memory.

In accordance with one aspect of the present invention, control component 2012 facilitates the evaluation of the surface of substrate 2008. According to this aspect of the present invention, control component 2012 is operatively coupled to light source 2002, optical detector 2004, data store component 2016 and artificial intelligence component 2018. By comparing observed optical signatures of light received by optical detector 2004 to acceptable optical signatures stored in either memory 2022 or data store component 2016, evaluation can be made as to the progress of etching processes that facilitate transfer of dual damascene features to various layers of substrate 2008.

In accordance with another aspect of the present invention, known optical signatures for known dimensions, locations, etc. for a given dual damascene pattern may be stored in data store component 2016 for comparison to an observed optical signature. According to this aspect of the invention, data store component 2016 is utilized to store a library of optical signatures representing both acceptable and unacceptable optical signatures. Acceptable optical signatures correspond to a range of acceptable characteristics such as for example a range of acceptable depths of penetration resulting from a dielectric etch of via features and/or trench features into a dielectric layer. Similarly, unacceptable optical signatures may correspond for example to a range of inadequate depths of penetration resulting from an insufficient dielectric etch of via and/or trench features into a dielectric layer and/or excessive depths of penetration from over etching of via and/or trench features too deep into the transfer layer.

In accordance with another aspect of the present invention, control component 2012, in conjunction with artificial intelligence component 2018, determines a next appropriate action based at least in part on the results of a comparison of an observed optical signature to a stored optical signature. For example, if the comparison of an observed optical signature to a library of stored optical signatures indicates inadequate depth of penetration of vias into a dielectric layer resulting from a dielectric etch, it may be determined that additional etching time is required to achieve the proper depth of penetration into the dielectric layer. In accordance with yet another aspect of the present invention, such information may be fed forward to alter the etching process for subsequent etches to achieve deeper penetration into the dielectric layer during the next etching cycle. Additionally or alternatively, the etching process may be resumed on the substrate in question to achieve an acceptable depth of penetration.

Described below is an example for purposes of illustration and not limitation on how generation of observed optical signatures for comparison to a library of optical signatures (referred to as scatterometry and comparison) is used in accordance with an aspect of the present invention. It is to be understood that scatterometry and comparison may be used in conjunction with any of the steps involved in the creation and transfer of dual damascene patterns in any of the substrate layers.

In accordance with one aspect of the present invention, scatterometry and comparison is used to evaluate the depth of penetration of the via features into the dielectric layer for purposes of controlling a first dielectric etch process. The first dielectric etch process effectuates the transfer of the via features of a dual damascene interconnect pattern into a dielectric layer. Scatterometry and comparison is used to determine when the depth of the vias as etched into the dielectric layer is within an acceptable range before proceeding onto a subsequent etching processes that facilitate the transfer of trench portions of a dual damascene pattern.

In accordance with one or more aspects of the present invention, FIG. 21 illustrates how a substrate 2102 may be partitioned for purposes of examining a surface of a substrate. In FIG. 21, substrate 2102, situated on a stage 2104, is logically partitioned into grid blocks. Each grid block (XY) of the grid pattern corresponds to a particular portion of substrate 2102. The desired dual damascene pattern associated with each grid block is a known pattern for which known optical signatures exist either from actual observation or through simulation and modeling. Each grid block portion is evaluated during processing of substrate 2102 and a corresponding observed optical signature is determined and evaluated for each grid block location.

In FIG. 22, one or more portions of the substrate grid blocks ($X_1Y_1 \ldots X_{12}, Y_{12}$) are evaluated by a scatterometry system for observed optical signatures using reflected and/or diffracted light. It is to be appreciated that although FIG. 22 illustrates a substrate partitioned into 144 grid block portions, the substrate may be partitioned into any suitable number of grid blocks. Given a set of acceptable expected optical signatures, a scatterometry system can determine if the dual damascene patterns in a surface match the characteristics of a desired dual damascene pattern by comparing the observed optical signature to the set of expected optical signatures. Similarly, the scatterometry system may generate feed forward information which can facilitate maintaining, terminating, and/or altering an etching process based at least in part on the results of comparing the observed optical signature to a set of acceptable optical signatures.

FIG. 23 illustrates a table 2300 recorded with results from comparing an observed optical signature to one or more expected optical signature(s) for the individual grid block locations. In table 2300, $S_E$ indicates that the observed signature matched an expected signature and $S_U$ indicates that the observed signature was unexpected and did not match an expected signature for the given grid block location. It can be seen that all the signatures are expected except a signature for grid block location $X_7Y_6$. The table of results can be analyzed for the desired pattern characteristics in specific grid block locations.

Figure 24:
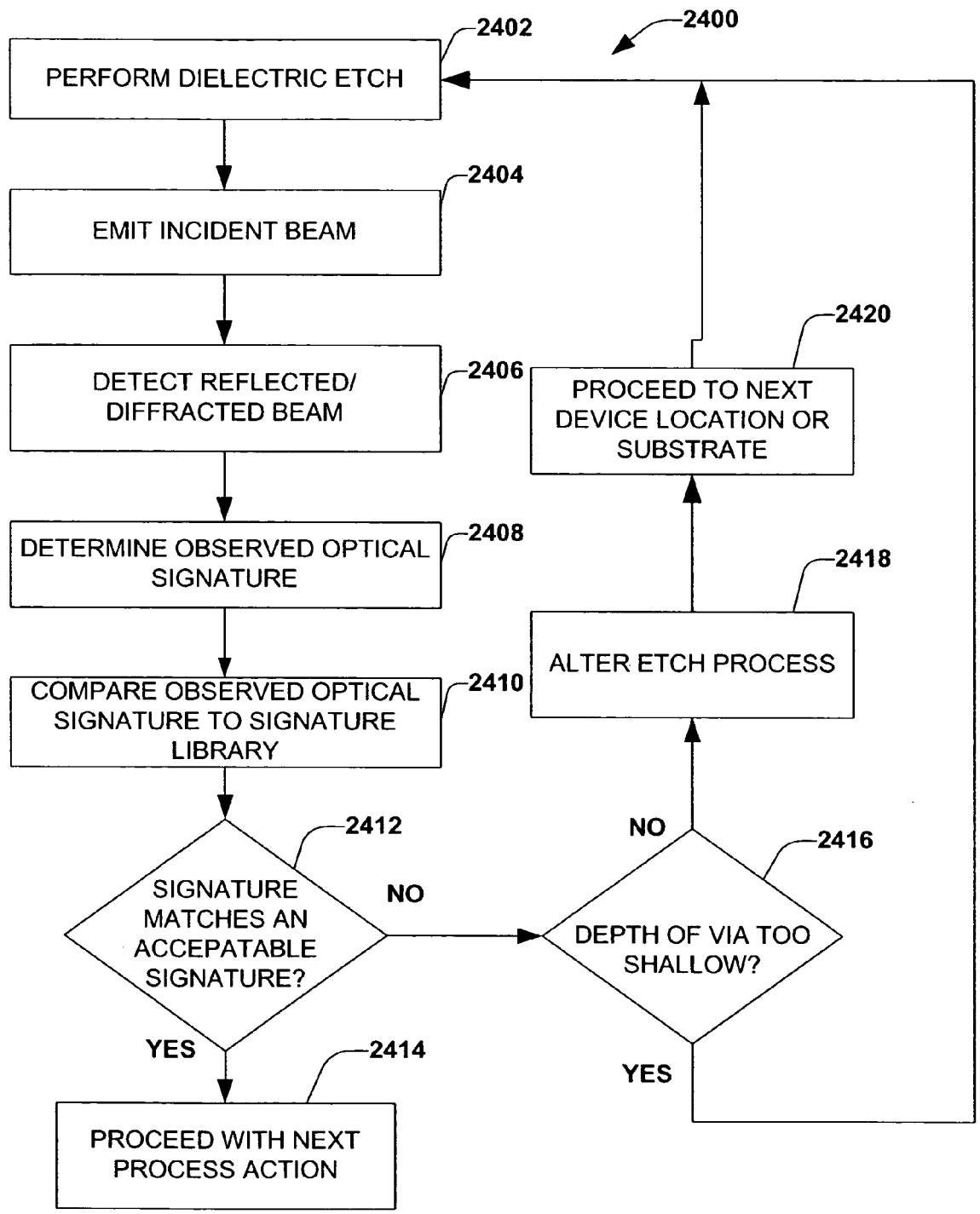
FIG. 24 is an illustration of a methodology that utilizes scatterometry on the surface of a substrate to evaluate pattern transfer in accordance with an aspect of the present invention.

In view of the exemplary systems shown and described above, methodologies 2300 and 2400 which may be implemented in accordance with one or more aspects of the present invention will be better appreciated with reference to the flow diagrams illustrated in FIG. 23 and FIG. 24 respectively. While, for purposes of simplicity of explanation, methodologies 2300 and 2400 are shown and described as a series of function blocks, it is to be understood and appreciated that the present invention is not limited by the order of the blocks, as some blocks may, in accordance with the present invention, occur in different orders and/or concurrently with other blocks from that shown and described herein. Moreover, not all illustrated blocks may be required to implement a methodology in accordance with the present invention. It is to be appreciated that the various blocks may be implemented via software, hardware, a combination thereof, or any suitable means (e.g., device, system, process, component, etc.) for carrying out the functionality associated with the blocks. It is also to be appreciated that the blocks are merely to illustrate certain aspects of the present invention in a simplified form and that these aspects may be illustrated via a lesser and/or greater number of blocks.

FIG. 24 illustrates a methodology 2400 that uses scatterometry to evaluate the pattern transfer on the surface of a substrate in accordance with an aspect of the present invention. Although the illustrated methodology applies to a dielectric etch that facilitates transfer of the via features of a dual damascene pattern from a first transfer layer to a dielectric layer, it is to be appreciated that the methodology can be applied to evaluate the pattern transfer at any stage of a dual damascene imprint lithography process.

Prior to the start of methodology 2400, a substrate has been prepared and processed in accordance with the present invention up to the point of transfer of the via features from a first imaging layer to a dielectric layer. Methodology 2400 begins at 2402 where a first dielectric etch is performed to facilitate transfer of the via features of the dual damascene pattern from the first imaging layer to the dielectric layer. After a prescribe amount of etching has been performed, an incident beam is emitted at 2404 from a light source component of a scatterometry component. The incident beam is directed at the surface of the substrate at a location under evaluation. At least a portion of the incident beam is reflected and/or diffracted from the surface of the substrate and is detected at 2406 by a detector component portion of the scatterometry component. At 2408, the scatterometry component determines an observed optical signature based at least in part on the characteristics of the reflected/diffracted beam from the location on the surface of the substrate.

At 2410, the observed optical signature is compared to a library of optical signatures. The library of signatures contains observed and/or simulated optical signatures corresponding to known conditions. The library includes a family of acceptable optical signatures corresponding to a range of acceptable values for the depth of penetration of the vias into the dielectric layer and a family of unacceptable optical signatures corresponding to unacceptable values for the depth of penetration of the vias into the dielectric layer. Unacceptable optical signatures correspond to conditions where the depth of penetration of the vias is either too deep or to shallow into the dielectric layer. At 2412 it is determined whether the observed optical signature matches any of the acceptable optical signatures. If the observed optical signature matches an acceptable optical signature, the methodology proceeds to 2414 where the process continues with the next action. However, if at 2412, it is determined that the optical signature does not match an acceptable optical signature, the methodology proceeds to 2416.

At 2416 the methodology determines whether the observed optical signature matches an unacceptable optical signature corresponding to the depth of penetration of the vias being too shallow. If the observed optical signature matches an optical signature from the family of signatures corresponding to the depth of penetration of the vias being to shallow, then the methodology returns to 2402 where the oxygen transfer etch is resumed to increase the depth of penetration of the via features. However, if at 2416 it is determined that observed optical signature matches an optical signature from the family of signatures corresponding to the depth of penetration of the vias being to deep, then the methodology proceeds to 2418 where the parameters of the etch process are altered to affect the subsequent etch processes such that the process will etch away less material. For example, the duration of a subsequent etch process may be reduced thereby resulting in less material being removed. At 2420, the methodology proceeds to the next grid location on the substrate or to the next substrate if all locations of the given substrate have been completed.

The above illustration is for a particular dielectric etch (i.e. a dielectric etch to transfer the via portion of a dual damascene pattern from a first imaging layer to a dielectric layer). However, it is understood that the above methodology may be applied and adapted to not only dielectric etches for vias, but also for trenches, other features, as well as other etch processes, such as for example, halogen breakthrough etches and oxygen transfer etches.

Figure 25:
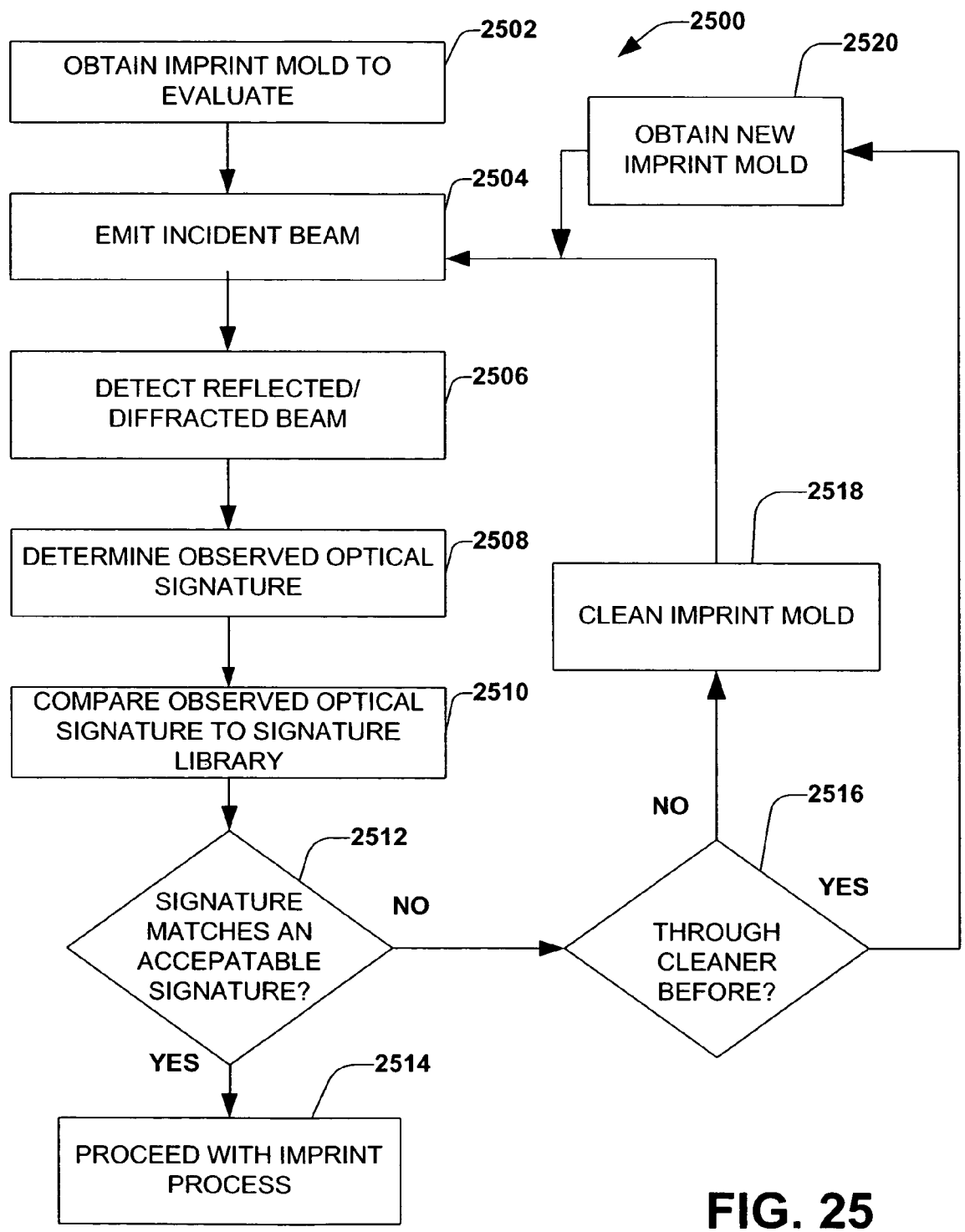
FIG. 25 illustrates a methodology to evaluate the surface of an imprint mold for contamination or wear in accordance with an aspect of the present invention.

In accordance another aspect of the present invention, scatterometry is used in a similar manner to evaluate the surface of an imprint mold for contamination or wear. Because imprint lithography brings the imprint mold into physical contact with the material comprising the imaging layer, the imprint mold is subject to contamination from residual material or other contaminants upon its imprint surface as well as physical wear over an extended period of use. FIG. 25 illustrates a methodology 2500 used to evaluate the surface of an imprint mold for contamination or wear. The evaluation by scatterometry may be made prior to an actual imprint operation or after completion of an imprint operation.

Methodology 2500 begins at 2502 by obtaining the imprint mold to be evaluated. At 2504 an incident beam is directed at the surface of the imprint mold at a location under evaluation. At least a portion of the incident beam is reflected and/or diffracted from the surface of the imprint mold and is detected at 2506 by a detector component portion of a scatterometry component. At 2508, the scatterometry component determines an observed beam optical signature based at least in part of the characteristics of the reflected/diffracted beam from the location under evaluation on the surface of the imprint mold.

At 2510, the observed optical signature is compared to a library of optical signatures. The library of optical signatures contains observed and/or simulated optical signatures corresponding to known conditions. The library includes a family of acceptable optical signatures corresponding to a substantially clean, unworn imprint surface. At 2512 it is determined whether the observed optical signature matches any of the acceptable optical signatures. If the observed optical signature matches an acceptable optical signature, then the surface of the imprint mold is substantially free from contaminants or wear which might create defects if this imprint mold were used to imprint a substrate. If the observed optical signature matches an acceptable optical signature, the methodology proceeds to 2514 where the methodology continues with the imprint process. However, if at 2512, it is determined that the optical signature does not match an acceptable optical signature, the methodology proceeds to 2516.

At 2516 the methodology determines whether the imprint mold has already been cleaned or not. If the imprint mold has not already been cleaned, then the methodology continues on to 2518 where a cleaning operation is performed on the imprint mold. After the cleaning operation is complete, the methodology returns to 2504 to begin another evaluation process. Returning to 2516, if it is determined at 2516 that the imprint mold has already been through the cleaning operation, then the methodology proceeds to 2520 where a new imprint mold is obtained for evaluation. Once a new imprint mold is obtained, the methodology returns to and proceeds from 2504.

While for purposes of illustration, the illustrated methodology determines whether the cleaning operation has been already performed one time, it is understood that the methodology can be used determine whether any specified number of cleaning operations has been performed. For example, perhaps the imprint mold might need to have up to five cleaning operations to remove certain contaminants. In this case, the methodology would allow a given imprint mold to cycle through the methodology for 5 cleaning operations and would not obtain a new imprint mold until the observed optical signature was unsatisfactory for a sixth time.

What has been described above are preferred aspects of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A method of integrating a dual damascene pattern to a dielectric layer comprising:
   transferring one or more via features from a first imaging layer into an upper portion of the dielectric layer;
   transferring one or more trench features from a second imaging layer into a transfer layer; and
   simultaneously transferring the one or more trench features from the transfer layer to the upper portion of the dielectric layer and the one or more via features from the upper portion of the dielectric layer to a lower portion of the dielectric layer.

2. The method of claim 1, transferring one or more via features comprising one or more halogen etches, one or more oxygen etches, and a dielectric etch.

3. The method of claim 1, transferring one or more trench features comprising one or more halogen etches and one or more oxygen etches.

4. The method of claim 1, simultaneously transferring comprising a dielectric etch.

5. The method of claim 1 further comprising evaluating a depth of penetration of the via features into the dielectric layer.

6. The method of claim 5, evaluating comprising:
emitting an incident beam of light incident at a known angle on a surface of the dielectric layer;
detecting a reflected/diffracted beam of light off of the surface of the dielectric layer;
determining an observed optical signature based at least in part on a set of characteristics of the reflected/diffracted beam of light detected; and
determining a depth of penetration into the dielectric layer by comparing the observed optical signature to a library of optical signatures wherein each optical signature in the library corresponds to a known depth of penetration into the dielectric layer.

7. The method of claim 1, the dielectric layer comprising silicon dioxide.

8. The method of claim 1, transferring one or more via features from the first imaging layer into the upper portion of the dielectric layer comprises using a first imprint lithography mold comprising via features.

9. The method of claim 1, transferring one or more trench features from the second imaging layer into the transfer layer comprises using a second imprint lithography mold comprising trench features.

10. A method of facilitating dual damascene interconnect integration into a dielectric layer of a substrate with two imprint acts, comprising:
forming a first imprint mold comprising one or more via features of a dual damascene pattern;
forming a second imprint mold comprising one or more trench features of the dual damascene pattern;
imprinting the substrate with the first imprint mold;
imprinting the substrate with the second imprint mold;
transferring the one or more via features from a first imaging layer into an upper portion of the dielectric layer;
transferring the one or more trench features from a second imaging layer into a transfer layer;
simultaneously transferring the one or more trench features from the transfer layer to the upper portion of the dielectric layer and the one or more via features from the upper portion of the dielectric layer to a lower portion of the dielectric layer;
determining a depth of penetration of the one or more via features into the dielectric layer;
filling the one or more trench features and the one or more via features in the dielectric layer with a conductive metal; and
planarizing a resultant surface of the substrate.

11. The method of claim 10, transferring the one or more via features comprising one or more halogen etches, one or more oxygen etches and a dielectric etch.

12. The method of claim 10, transferring the one or more trench features comprising one or more halogen etches and one or more oxygen etches.

13. The method of claim 10, simultaneously transferring comprising a dielectric etch.

14. The method of claim 10, determining comprising:
emitting an incident beam of light incident at a known angle on a surface of the dielectric layer;
detecting a reflected/diffracted beam of light off of the surface of the dielectric layer;
determining an observed optical signature based on a set of characteristics of the reflected/diffracted beam of light; and
comparing the observed optical signature to a library of optical signatures wherein each optical signature in the library corresponds to a known depth of penetration into the dielectric layer.

15. The method of claim 14, the set of characteristics of the reflected/diffracted light detected comprising:
one or more wavelengths;
one or more intensities;
one or more phases; and
a location of detection associated with each detected light.

16. The method of claim 10, the first and second imaging layers comprising low viscosity photopolymerizable organosilicon, the transfer layer comprising a photoresist material, and the dielectric layer material comprising at least one selected from the group consisting of silicon dioxide, silicon nitride, silicon oxynitride, fluorine doped silicon glass, tetraethylorthosilicate, borophosphotetraethylorthosilicate, phosphosilicate glass, borophosphosilicate glass, polyimides, fluorinated polyimides, polysilsequioxane, benzocyclobutene, poly(arylene ester), parylene F, parylene N and amorphous polytetrafluoroethylene.

17. A method of integrating a dual damascene pattern to a silicon based dielectric layer comprising:
transferring one or more via features from a first imaging layer into an upper portion of the silicon based dielectric layer;
transferring one or more trench features from a second imaging layer into a transfer layer; and
simultaneously transferring the one or more trench features from the transfer layer to the upper portion of the silicon based dielectric layer and the one or more via features from the upper portion of the silicon based dielectric layer to a lower portion of the silicon based dielectric layer.

18. The method of claim 17, the silicon based dielectric layer comprising silicon dioxide.

19. The method of claim 17, the transferring one or more via features comprising one or more halogen etches, one or more oxygen etches, and a silicon based dielectric etch; and transferring one or more trench features comprising one or more halogen etches and one or more oxygen etches.

20. A method of integrating a dual damascene pattern to a dielectric layer comprising:
transferring one or more via features from a first imaging layer into an upper portion of the dielectric layer;
transferring one or more trench features from a second imaging layer into an organic transfer layer; and
simultaneously transferring the one or more trench features from the organic transfer layer to the upper portion of the dielectric layer and the one or more via features from the upper portion of the dielectric layer to a lower portion of the dielectric layer.

21. The method of claim 20 further comprising evaluating a depth of penetration of the via features into the dielectric layer.

22. The method of claim 20, evaluating comprising:
emitting an incident beam of light incident at a known angle on a surface of the dielectric layer;
detecting a reflected/diffracted beam of light off of the surface of the dielectric layer;
determining an observed optical signature based at least in part on a set of characteristics of the reflected/diffracted beam of light detected; and
determining a depth of penetration into the dielectric layer by comparing the observed optical signature to a library of optical signatures wherein each optical signature in the library corresponds to a known depth of penetration into the dielectric layer.

* * * * *